United States Patent
Tone et al.

(10) Patent No.: US 10,370,464 B2
(45) Date of Patent: Aug. 6, 2019

(54) PIGMENT DISPERSION LIQUID CONTAINING ORGANIC COLOR PIGMENT AND INFRARED ABSORBING DYE, COLORED RESIN COMPOSITION, AND OPTICAL FILTER

(71) Applicant: NIPPON KAYAKU KABUSHIKI KAISHA, Tokyo (JP)

(72) Inventors: Yusuke Tone, Tokyo (JP); Takashi Yoshimoto, Tokyo (JP); Satoshi Kobayashi, Tokyo (JP)

(73) Assignee: NIPPON KAYAKU KABUSHIKI KAISHA, Tokyo (JP)

( * ) Notice: Subject to any disclaimer, the term of this patent is extended or adjusted under 35 U.S.C. 154(b) by 53 days.

(21) Appl. No.: 15/739,592

(22) PCT Filed: Jun. 30, 2016

(86) PCT No.: PCT/JP2016/069446
§ 371 (c)(1),
(2) Date: Dec. 22, 2017

(87) PCT Pub. No.: WO2017/002920
PCT Pub. Date: Jan. 5, 2017

(65) Prior Publication Data
US 2018/0179306 A1    Jun. 28, 2018

(30) Foreign Application Priority Data
Jul. 1, 2015   (JP) .................. 2015-132407

(51) Int. Cl.
*G02B 5/20* (2006.01)
*C08F 20/28* (2006.01)
*C08F 2/44* (2006.01)
*C08F 2/48* (2006.01)
*C09B 47/04* (2006.01)
*G02B 5/22* (2006.01)
*G03F 7/00* (2006.01)
*G03F 7/105* (2006.01)
*C09B 67/08* (2006.01)
*C09B 67/22* (2006.01)
*G03F 7/027* (2006.01)
*G03F 7/031* (2006.01)

(52) U.S. Cl.
CPC ............. *C08F 20/28* (2013.01); *C08F 2/44* (2013.01); *C08F 2/48* (2013.01); *C09B 47/045* (2013.01); *C09B 67/0009* (2013.01); *C09B 67/0033* (2013.01); *C09B 67/0034* (2013.01); *C09B 67/0035* (2013.01); *G02B 5/208* (2013.01); *G02B 5/223* (2013.01); *G03F 7/0007* (2013.01); *G03F 7/105* (2013.01); *G03F 7/027* (2013.01); *G03F 7/031* (2013.01)

(58) Field of Classification Search
CPC ....... G03F 7/0007; G03F 7/031; G02B 5/208; G02B 5/223; H01L 27/14621
USPC .................................. 430/7, 281.1; 257/440
See application file for complete search history.

(56) References Cited

U.S. PATENT DOCUMENTS

2007/0109548 A1* 5/2007 Uchida ............ H01L 27/14621
356/456

FOREIGN PATENT DOCUMENTS

| JP | 1039127 | | 2/1998 |
|----|---------|----|--------|
| JP | 2003337410 | A2 | 11/2003 |
| JP | 2006343631 | A2 | 12/2006 |
| JP | 2012077153 | A1 | 4/2012 |
| WO | 2014017295 | A1 | 1/2014 |
| WO | 2014041742 | A1 | 3/2014 |

OTHER PUBLICATIONS

International Preliminary Report on Patentability dated Jan. 11, 2018 filed in PCT/JP2016/069446, total 6 pages.
International Search Report dated Aug. 2, 2016 filed in PCT/JP2016/069446.

* cited by examiner

*Primary Examiner* — John A McPherson
(74) *Attorney, Agent, or Firm* — Rankin, Hill & Clark LLP

(57) ABSTRACT

The present invention addresses the problem of providing: a pigment dispersion liquid with which an optical filter layer having the functions of both a color filter and a near-infrared cut filter can be formed by performing a development step once, and with which a thin filter achieved by using a single-layer configuration instead of a conventional two-layer configuration can be fabricated; and a colored resin composition containing the pigment dispersion liquid. The present invention provides a pigment dispersion liquid containing one or more organic color pigments selected from the group consisting of pigment red, pigment green, pigment blue, pigment yellow, and pigment violet, an infrared absorbing dye having a maximum absorption wavelength in a wavelength range of 750-2000 nm, and an oil-soluble organic solvent or an aqueous medium, and a colored resin composition containing the dispersion liquid.

6 Claims, No Drawings

PIGMENT DISPERSION LIQUID CONTAINING ORGANIC COLOR PIGMENT AND INFRARED ABSORBING DYE, COLORED RESIN COMPOSITION, AND OPTICAL FILTER

TECHNICAL FIELD

The present invention relates to a pigment dispersion liquid, a colored resin composition, and a near-infrared ray cut filter having a color filter function. More specifically, the present invention relates to a pigment dispersion liquid and a colored resin composition used for producing a color filter and a near-infrared ray cut filter which are used in a solid-state image sensing device, and a near-infrared ray cut filter having the function of a color filter having a colored pattern formed using the colored resin composition.

BACKGROUND ART

In general, a color filter is required to capture a color image by a solid-state image sensing device (image sensor). A conventionally used color filter functions as a filter which transmits only three primary colors of blue, green, and red in a visible light region, but it has low cutting ability for light in a near-infrared light region, and transmits near-infrared light. Since a silicon substrate used for the solid-state image sensing device has spectral sensitivity over a near-infrared light region in a visible light region to around 1100 nm, signals of near-infrared light are mixed with red, green, and blue signals under the influence of near-infrared light when only the conventional color filter is used, resulting in a difference with luminosity factor of human eyes.

In order to solve this problem, there has been proposed a method for eliminating the influence of near-infrared light using a near-infrared ray cut filter layer in combination with a color filter layer, and taking in only red, green and blue light into a pixel to perform photoelectric conversion. Patent Literature 1 describes a method for providing an inorganic multilayer film composed of a low refractive index material and a high refractive index material as a near-infrared ray cut filter layer under a color filter layer.

On the other hand, from the viewpoints of weight reduction and noise reduction and the like of a recent solid-state image sensing device, a thinner near-infrared ray cut filter layer has been required. Patent Literature 2 describes a method for providing a thinner near-infrared ray cut filter layer using a multifunctional polymerizable compound for a near-infrared absorptive composition for forming the near-infrared ray cut filter. From the viewpoint of improvement in image quality due to high light collection properties and high color separation properties, a thinner color pattern in a color filter for a solid-state image sensing device also has been required.

For the purpose of improving the reliability of the solid-state image sensing device, further improvement in heat resistance of a color filter and a near-infrared ray cut filter also has been demanded. Patent Literature 3 describes improvement in the heat resistance of a color filter using a specific dipyrromethene-based compound in combination with a phthalocyanine compound or a squarylium compound as a near-infrared absorbing agent.

CITATION LIST

Patent Literature

Patent Literature 1: WO 2014/041742 A
Patent Literature 2: WO 2014/017295 A
Patent Literature 3: JP-A-2012-77153

SUMMARY OF INVENTION

Problem to be Solved by Invention

However, in the conventional solid-state image sensing device, it is common to provide the color filter layer and the infrared cut filter layer separately on the silicon substrate. Since this configuration is a two-layer configuration including the color filter layer and the infrared cut filter layer, the configuration has a limitation in a decrease in the thickness thereof. The existing infrared cut filter is composed of inorganic glass or an inorganic multilayer film as described in PATENT LITERATURE 1, which makes it difficult to form a single layer with the color filter. This inevitability causes a two-layer configuration. In the two-layer configuration, the producing step of the solid-state image sensing device is disadvantageously complicated due to the necessity of respectively forming the color filter layer and the infrared cut filter layer in the process.

An object of the present invention is to provide a pigment dispersion liquid capable of forming an optical filter layer having the functions of both a color filter and a near-infrared ray cut filter by performing a development step once, and of producing a thin filter using a single layer configuration instead of a conventional two-layer configuration, and a colored resin composition containing the pigment dispersion liquid.

Solution to Problem

As a result of intensive studies to solve the above-mentioned problems, the present inventors have found that the problems can be solved by using a colored resin composition comprising a pigment dispersion liquid comprising an organic color pigment and an infrared absorbing dye, leading to completion of the present invention.

That is, aspects of the present invention are as follows.

[1]. A pigment dispersion liquid comprising: one or more organic color pigments selected from the group consisting of pigment red, pigment green, pigment blue, pigment yellow, and pigment violet; an infrared absorbing dye having a maximum absorption wavelength in a wavelength region of 750 to 2000 nm; and an oil-soluble organic solvent or an aqueous medium.

[2]. The pigment dispersion liquid according to the above item [1], wherein the infrared absorbing dye is a naphthalocyanine compound, and, optionally, at least one selected from the group consisting of cyanine type, phthalocyanine type, diimmonium type, phosphoric acid ester copper complex type, sulfonic acid copper complex type, squarilium type, chroconium type, diketopyrrolopyrrole type, polymethine type, metal diol complex type, porphyrin type, azomethine type, and oxonol type dye compounds, and inorganic oxide particles which are used in combination with the naphthalocyanine compound.

[3]. The pigment dispersion liquid according to the above item [1], wherein the infrared absorbing dye is an organic pigment.

[4]. The pigment dispersion liquid according to the above item [2], wherein the infrared absorbing dye is a naphthalocyanine compound.

[5]. The pigment dispersion liquid according to any one of the above items [2] to [4], wherein the infrared absorbing dye is a compound represented by the following formula (1):

(1)

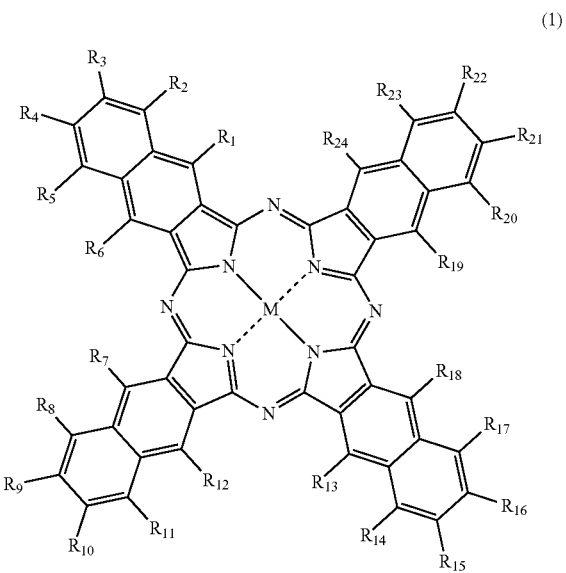

wherein $R_1$ to $R_{24}$ each independently represent a hydrogen atom, a halogen atom, a substituted or unsubstituted alkyl group having 1 to 20 carbon atoms, a substituted or unsubstituted aryl group having 6 to 20 carbon atoms, a substituted or unsubstituted heterocyclic group having 4 to 20 carbon atoms, —$OR_{25}$ or —$SR_{26}$: $R_{25}$ and $R_{26}$ each independently represent a hydrogen atom, a substituted or unsubstituted alkyl group having 1 to 20 carbon atoms, or a substituted or unsubstituted aryl group having 6 to 20 carbon atoms; and M represents two hydrogen atoms, a metal atom, a metal oxide, or a metal halide.

[6]. The pigment dispersion liquid according to any one of the above items [1] to [5], wherein the organic color pigment is one or more selected from the group consisting of pigment red 122, pigment red 177, pigment red 209, pigment red 254, pigment red 269, pigment green 7, pigment green 36, pigment green 58, pigment blue 15:3, pigment blue 15:4, pigment blue 15:6, pigment yellow 138, pigment yellow 139, pigment yellow 150, and pigment violet 23.

[7]. A colored resin composition comprising the pigment dispersion liquid according to any one of the above items [1] to [6] and a photopolymerizable monomer.

[8]. The colored resin composition according to the above item [7], wherein the photopolymerizable monomer is an acrylate monomer.

[9]. The colored resin composition according to the above item [8], wherein the photopolymerizable monomer is an alkylene oxide-modified acrylate monomer.

[10]. The colored resin composition according to any one of the above items [7] to [9], further comprising an aminoalkylphenone-based photopolymerization initiator or an oxime-based photopolymerization initiator.

[11]. A color filter comprising the colored resin composition according to any one of the above items [7] to [10].

[12]. An infrared cut filter comprising the colored resin composition according to any one of the above items [7] to [10].

[13]. A solid-state image sensing device comprising the color filter according to the above item [11] or the infrared cut filter according to the above item [12].

Advantageous Effects of Invention

The present invention can provide a pigment dispersion liquid and a colored resin composition which can produce a thin filter having the functions of both a color filter and a near-infrared ray cut filter.

The present invention uses a specific infrared absorbing dye, which makes it possible to obtain an optical filter having excellent heat resistance.

DESCRIPTION OF EMBODIMENTS

A pigment dispersion liquid of the present invention contains one or more organic color pigments selected from the group consisting of conventionally known pigment red, pigment green, pigment blue, pigment yellow, and pigment violet.

The organic color pigment contained in the pigment dispersion liquid of the present invention preferably has spectral characteristics suitable for a color filter. Specific examples of a red organic color pigment include pigment reds 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 269, 270, 272, and 279.

Specific examples of a yellow organic color pigment include pigment yellows 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213,and 214.

Specific examples of a blue organic color pigment include pigment blues 1, 1:2, 9, 14, 15, 15:1. 15:2, 15:3, 15:4, 15:6, 16, 17, 19, 25, 27, 28, 29, 33.35, 36, 56, 56:1, 60, 61, 61:1, 62, 63, 66, 67, 68, 71, 72, 73, 74, 75, 76, 78, and 79.

Specific examples of a violet organic color pigment include pigment violets 1, 1:1, 2, 2:2, 3, 3:1, 3:3, 5, 5:1, 14, 15, 16, 19, 23, 25, 27, 29, 31, 32, 37, 39, 42, 44, 47, 49, and 50. Specific examples of a green organic color pigment include pigment greens 7, 36, and 58.

Among these organic color pigments, pigment red 122, pigment red 177, pigment red 209, pigment red 254, pigment red 269, pigment yellow 138, pigment yellow 139, pigment yellow 150, pigment blue 15:3, pigment blue 15:4, pigment blue 15:6, pigment violet 23, pigment green 7, pigment green 36, and pigment green 58 and the like are preferable.

The content of the organic color pigment in the pigment dispersion liquid of the present invention is usually 1 to 80 parts by mass, and preferably 30 to 80 parts by mass with respect to 100 parts by mass of the total solid content in the pigment dispersion liquid (refer to the total amount of an organic color pigment and an infrared absorbing dye which are indispensable components and a solid component excluding solvents such as a dispersant, a dispersing aid, and a binder resin which are optional components). The content of the organic color pigment in the pigment dispersion liquid is within the above range, which can provide sufficient color purity without causing the problem of dispersion stability such as aggregation.

The organic color pigment contained in the pigment dispersion liquid of the present invention is preferably finer. Considering handling properties and the like, the organic color pigment has an average primary particle diameter of, preferably 100 nm or less, more preferably 5 to 80 nm, and still more preferably 5 to 50 nm. The average primary particle diameter of the organic color pigment can be measured by a known method such as electron microscope.

The infrared absorbing dye contained in the pigment dispersion liquid of the present invention is not particularly limited as long as it is an infrared absorbing dye having a maximum absorption wavelength (λmax) in a wavelength region of 750 to 2000 nm, and can be appropriately selected from dyes, organic pigments, and inorganic pigments. The infrared absorbing dyes can be used alone or in combination of two or more if necessary. The content of the infrared absorbing dye in the pigment dispersion liquid is usually 1 to 70 parts by mass, and preferably 1 to 50 parts by mass with respect to 100 parts by mass of the total solid content. The content of the infrared absorbing dye in the pigment dispersion liquid is set within the above range, which can provide sufficient light shielding property in an infrared wavelength region without causing a decrease in transmittance in a visible wavelength range, and problems in dispersion stability such as aggregation.

The infrared absorbing dye has a maximum absorption wavelength (λmax) in a wavelength region of, preferably 750 to 1500 nm, and more preferably 780 to 1000 nm. By using the infrared absorbing dye having a maximum absorption wavelength in the above wavelength region, light having a target wavelength region is efficiently absorbed.

The maximum absorption wavelength in the present invention means a wavelength at which the absorbance of an absorption band in the above wavelength region is maximized.

Examples of the infrared absorbing dye contained in the pigment dispersion liquid of the present invention include, but are not limited to, cyanine type, phthalocyanine type, naphthalocyanine type, diimonium type, phosphoric acid ester copper complex type, sulfonic acid copper complex type, squarilium type, chroconium type, diketopyrrolopyrrole type, polymethine type, metal dithiol complex type, porphyrin type, azomethine type, and oxonol type dye compounds, and inorganic oxide particles. Among these infrared absorbing dye compounds, the phthalocyanine type and naphthalocyanine type compounds are preferable in terms of reliability and coloring power, and the naphthalocyanine compound represented by the above formula (1) is particularly preferable. In a preferred embodiment, the infrared absorbing dye substantially contains the naphthalocyanine compound. In another preferred embodiment, the infrared absorbing dye contains the naphthalocyanine compound and at least one of any other dye compounds.

In the formula (1), $R_1$ to $R_{24}$ each independently represent a hydrogen atom, a halogen atom, a substituted or unsubstituted alkyl group having 1 to 20 carbon atoms, a substituted or unsubstituted aryl group having 6 to 20 carbon atoms, a substituted or unsubstituted heterocyclic group having 4 to 20 carbon atoms, and —$OR_{25}$, or —$SR_{26}$ and $R_{25}$ and $R_{26}$ each independently represent a hydrogen atom, a substituted or unsubstituted alkyl group having 1 to 20 carbon atoms, and a substituted or unsubstituted aryl group having 6 to 20 carbon atoms.

Examples of the halogen atom represented by $R_1$ to $R_{24}$ in the formula (1) include a fluorine atom, a chlorine atom, a bromine atom, and an iodine atom.

The alkyl group having 1 to 20 carbon atoms represented by $R_1$ to $R_{24}$ in the formula (1) is not particularly limited as long as it is a saturated aliphatic hydrocarbon group having 1 to 20 carbon atoms. The alkyl group may have a branch or may form a ring.

Specific examples of the alkyl group having 1 to 20 carbon atoms represented by $R_1$ to $R_{24}$ in the formula (1) include a methyl group, an ethyl group, a n-propyl group, an iso-propyl group, a n-butyl group, an iso-butyl group, a sec-butyl group, a t-butyl group, a n-pentyl group, an iso-pentyl group, a neo-pentyl group, a 1,2-dimethyl-propyl group, a n-hexyl group, an isohexyl group, a sec-hexyl group, a n-heptyl group, an iso-heptyl group, a sec-heptyl group, a n-octyl group, a 2-ethylhexyl group, a 3-methyl-1-isopropylbutyl group, a 1-t-butyl-2-methylpropyl group, a n-nonyl group, 3,5,5-trimethylhexyl group, a n-decyl group, a n-dodecyl group, a cyclohexyl group, a cyclopentyl group, a cyclohexylmethyl group, a cyclohexylethyl group, a cyclopentylmethyl group, and a cyclopentylethyl group.

The alkyl group having 1 to 20 carbon atoms represented by $R_1$ to $R_{24}$ in the formula (1) is preferably a linear or branched alkyl group having 1 to 12 carbon atoms, and more preferably a linear or branched alkyl group having 1 to 8 carbon atoms.

The alkyl group having 1 to 20 carbon atoms represented by $R_1$ to $R_{24}$ in the formula (1) may have a substituent. Examples of the substituent include an alkoxy group, a halogen group, an amino group, a cyano group, and a nitro group, but the substituent is not limited thereto.

Herein, the term "substituted" in the substituted alkyl group having 1 to 20 carbon atoms means that one or more hydrogen atoms of a saturated aliphatic hydrocarbon group having 1 to 20 carbon atoms are substituted with the above-mentioned substituents such as an alkoxy group, a halogen group, an amino group, a cyano group, and a nitro group. The term "unsubstituted" means that the hydrogen atom of the saturated aliphatic hydrocarbon group having 1 to 20 carbon atoms is not substituted with a substituent such as an alkoxy group, a halogen group, an amino group, a cyano group, or a nitro group. The terms "substituted" and "unsubstituted" are hereinafter used in the same meanings as those described in this paragraph.

The aryl group having 6 to 20 carbon atoms represented by $R_1$ to $R_{24}$ in the formula (1) is not particularly limited as long as it is a residue obtained by removing one hydrogen atom from an aromatic ring having 6 to 20 carbon atoms. Specific examples thereof include a phenyl group, a phenylethyl group, an o-, m- or p-tolyl group, a 2,3- or 2,4-xylyl group, a mesityl group, a naphthyl group, an anthryl group, a phenanthryl group, a biphenylyl group, a benzhydryl group, a trityl group, and a pyrenyl group. The phenyl group is particularly preferred.

The aryl group having 6 to 20 carbon atoms represented by $R_1$ to $R_{24}$ in the formula (1) may have a substituent. Examples of the substituent include the same as the substituent which may be contained in the alkyl group having 1 to 20 carbon atoms represented by $R_1$ to $R_{24}$ in the formula (1).

The heterocyclic group having 4 to 20 carbon atoms represented by $R_1$ to $R_{24}$ in the formula (1) is not particularly limited as long as it is a residue obtained by removing one hydrogen atom from a heterocyclic ring having 4 to 20 carbon atoms. Specific examples thereof include a pyridyl group, a pyrrolyl group, an oxazolyl group, an isoxazolyl group, a thiazolyl group, an isothiazolyl group, an imidazolyl group, an oxadiazolyl group, a thiadiazolyl group, a triazolyl group, a tetrazolyl group, a pyrazolyl group, a pyrimidinyl group, a pyridazinyl group, a pyrazinyl group, a triazinyl group, an indolyl group, an isoindolyl group, a benzimidazolyl group, a benzoxazolyl group, a benzothiazolyl group, a quinolyl group, an isoquinolyl group, a purinyl group, a carbazolyl group, an acridinyl group, a phenoxazinyl group, and a phenothiazinyl group. The pyridyl group is particularly preferred.

The heterocyclic group having 4 to 20 carbon atoms represented by $R_1$ to $R_{24}$ in the formula (1) may have a substituent. Examples of the substituent include the same as the substituent which may be contained in the alkyl group having 1 to 20 carbon atoms represented by $R_1$ to $R_{24}$ in the formula (1).

Examples of the alkyl group having 1 to 20 carbon atoms represented by $R_{25}$ and $R_{26}$ in the formula (1) include the same as the alkyl group having 1 to 20 carbon atoms represented by $R_1$ to $R_{24}$ in the formula (1).

The alkyl group having 1 to 20 carbon atoms represented by $R_{25}$ and $R_{26}$ in the formula (1) may have a substituent. Examples of the substituent include the same as the substituent which may be contained in the alkyl group having 1 to 20 carbon atoms represented by $R_1$ to $R_{24}$ in the formula (1).

Examples of the aryl group having 6 to 20 carbon atoms represented by $R_{25}$ and $R_{26}$ in the formula (1) include the same as the aryl group having 6 to 20 carbon atoms represented by $R_1$ to $R_{24}$ in the formula (1).

The amyl group having 6 to 20 carbon atoms represented by $R_{25}$ and $R_{26}$ in the formula (1) may have a substituent. Examples of the substituent include the same as the substituent which may be contained in the alkyl group having 1 to 20 carbon atoms represented by $R_1$ to $R_{24}$ in the formula (1).

It is preferable that $R_1$ to $R_{24}$ in the formula (1) each independently represent a hydrogen atom or a substituted or unsubstituted aryl group having 6 to 20 carbon atoms. It is more preferable that $R_1$ to $R_{24}$ are all hydrogen atoms; $R_1$, $R_2$ to $R_5$, $R_7$, $R_8$ to $R_{11}$, $R_{13}$, $R_{14}$ to $R_{17}$, $R_{19}$, and $R_{20}$ to $R_{23}$ are hydrogen atoms, and $R_6$, $R_{12}$, $R_{18}$, and $R_{24}$ are unsubstituted aryl groups having 6 to 20 carbon atoms; or $R_2$ to $R_5$, $R_6$, $R_8$ to $R_{11}$, $R_{12}$, $R_{14}$ to $R_{17}$, $R_{18}$, $R_{20}$ to $R_{23}$, and $R_{24}$ are hydrogen atoms, and $R_1$, $R_7$, $R_{13}$, and R are unsubstituted aryl groups having 6 to 20 carbon atoms. It is still more preferable that $R_1$ to $R_{24}$ are all hydrogen atoms; $R_1$, $R_2$ to $R_5$, $R_7$, $R_8$ to $R_{11}$, $R_{13}$, $R_{14}$ to $R_{17}$, $R_{19}$, and $R_{20}$ to $R_{23}$ are hydrogen atoms, and $R_6$, $R_{12}$, $R_{18}$, and $R_{24}$ are phenyl groups; or $R_2$ to $R_5$, $R_6$, $R_8$ to $R_{11}$, $R_{12}$, $R_{14}$ to $R_{17}$, $R_{18}$, $R_{20}$ to $R_{23}$, and $R_{24}$ are hydrogen atoms, and $R_1$, $R_7$, $R_{13}$, and $R_{19}$ are phenyl groups.

In the formula (1), M represents two hydrogen atoms, a metal atom, a metal oxide, or a metal halide. When M represents two hydrogen atoms, a structure is formed, in which N—M—N moieties in the formula (1) are represented as two N—Hs.

Examples of the metal atom represented by M in the formula (1) include iron, magnesium, nickel, cobalt, copper, palladium, zinc, vanadium, titanium, indium, and tin.

Examples of the metal oxide represented by M in the formula (1) include titanyl and vanadyl.

Examples of the metal halide represented by M in the formula (1) include aluminum chloride, indium chloride, germanium chloride, tin (II) chloride, tin (IV) chloride, and silicon chloride.

M in the formula (1) is preferably copper, zinc, cobalt, nickel, iron, vanadyl, titanyl, indium chloride, or tin (II) chloride, more preferably copper, zinc, vanadyl, or titanyl, and particularly preferably vanadyl.

When the pigment dispersion liquid of the present invention contains a dipyrromethene-based complex compound in which a dipyrromethene-based compound represented by the following general formula (a) is coordinated to a boron atom, a boron compound, a metal atom, or a metal compound, or a tautomer thereof, the storage stability of the colored resin composition containing the pigment dispersion liquid (described later) is deteriorated, which is not preferable. Accordingly, in one embodiment, the pigment dispersion liquid of the present invention does not contain a dipyrromethene-based compound represented by the following general formula (a).

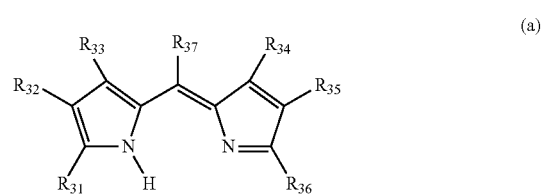

In the formula (a), $R_{31}$ to $R_{36}$ each independently represent a hydrogen atom or a monovalent substituent, and $R_{37}$ represents a hydrogen atom, a halogen atom, an alkyl group, an aryl group, or a heterocyclic group.

The structure of such a dipyrromethene-based compound represented by the general formula (a) is known, and is specifically illustrated in, for example, JP-A-2012-77153.

When the infrared absorbing dye is present in the pigment dispersion liquid in a state of being dissolved in an oil-soluble organic solvent or an aqueous medium, the heat resistance of the cured product of the colored resin composition containing the pigment dispersion liquid tends to be deteriorated. Therefore, it is preferable that the infrared absorbing dye is present in the pigment dispersion liquid in a state of being dispersed in an oil-soluble organic solvent or an aqueous medium.

Next, a method for manufacturing the compound represented by the formula (1) will be described. The method for manufacturing the compound represented by the formula (1) is not particularly limited, and conventionally known methods can be suitably used. For example, there has been known a method for synthesizing naphthalocyanine having a metal at its center from corresponding naphthalene dicarboxylic acid or a derivative thereof (acid anhydride, diamide, and dinitrile and the like) in the coexistence of a metal compound through a direct cyclization reaction (see, for example, Chemistry-A•European Journal, Volume 9, 5123-5134 (2003 issue)). At this time, it is preferable to make a catalyst (eg, ammonium molybdate) and urea coexist. Alternatively, the compound can be synthesized by firstly preparing a metal-free compound of naphthalocyanine using a lithium compound and then carrying out a reaction with a metal compound as described later.

The cyclization reaction can also be carried out in the absence of a solvent, but it is preferably carried out in an organic solvent. The organic solvent which can be used for the cyclization reaction is not particularly limited as long as it has low reactivity with naphthalenedicarboxylic acid or a derivative thereof as a starting material, but it is preferably an inert solvent which does not show reactivity. Examples of the organic solvent include inert solvents such as benzene, toluene, xylene, nitrobenzene, monochlorobenzene, o-chlorotoluene, dichlorobenzene, trichlorobenzene, 1-chloronaphthalene, 1-methylnaphthalene, ethylene glycol, and benzonitrile; alcohols such as methanol, ethanol, 1-propanol, 2-propanol, 1-butanol, 1-hexanol, 1-pentanol, and 1-octanol and aprotic polar solvents such as pyridine, N,N-dimethylformamide, N,N-dimethylacetamide, N-methyl-2-pyrrolidinone, N,N-dimethylacetophenone, triethylamine, tri-n-butylamine, dimethyl sulfoxide, and sulfolane. Of these, 1-chloronaphthalene, 1-methylnaphthalene, 1-octanol, dichlorobenzene, benzonitrile, and sulfolane are preferable, and 1-octanol, dichlorobenzene, benzonitrile, and sulfolane are more preferable. These solvents may be used alone or in combination of two or more.

The amount of the naphthalene dicarboxylic acid or its derivative and the metal compound used in the cyclization reaction is not particularly limited as long as the reaction proceeds. However, for example, the naphthalene dicarboxylic acid or its derivative is usually used in the range of 1 to 500 parts by mass, and preferably 10 to 350 parts by mass with respect to 100 parts of the organic solvent, and the metal compound is usually used in the range of 0.25 to 0.5 mol, and preferably 0.25 to 0.4 mol with respect to 1 mol of the naphthalene dicarboxylic acid or its derivative. The conditions of the cyclization reaction are also not particularly limited, but the reaction temperature is preferably in the range of 30 to 250° C., and more preferably 80 to 200° C. The reaction time is preferably 1 to 30 hours. The cyclization reaction may be performed in an air atmosphere, but it is preferably performed in an inert gas atmosphere (for example, under the flow of nitrogen gas, helium gas, or argon gas and the like).

Regarding to the ratio of the raw material used in synthesizing the compound represented by the formula (1) using the metal-free compound of naphthalocyanine and the metal compound, 0.1 to 10 mol of the metal compound is preferably used with respect to 1 mol of the metal-free compound of naphthalocyanine, more preferably 0.5 to 5 mol, and still more preferably to 3 mol. As the metal compound, inorganic and organic metal compounds can be used. Specific examples thereof include halides (eg, chlorides, bromides), sulfates, acetates, and acetylacetonates of metals. The halides and the acetates are preferable, and the halides are more preferable.

The compound obtained by the above reaction may be subjected to crystallization, filtration, washing, and drying and the like according to a conventionally known method.

By such an operation, the naphthalocyanine compound represented by the formula (1) can be efficiently obtained with high purity.

Specific examples of the compound represented by the formula (1) are shown below, but the present invention is not limited thereto.

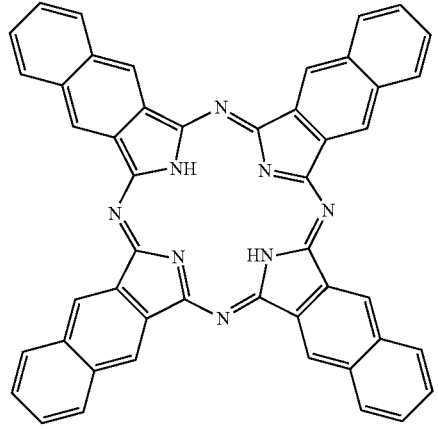

No.1

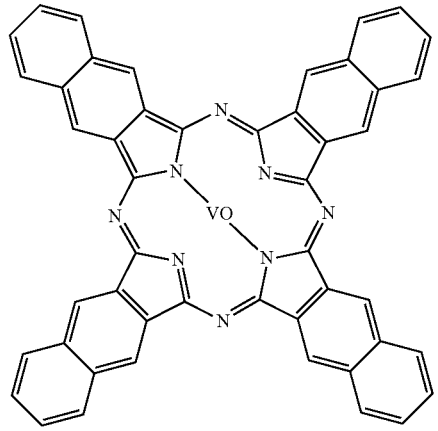

No.2

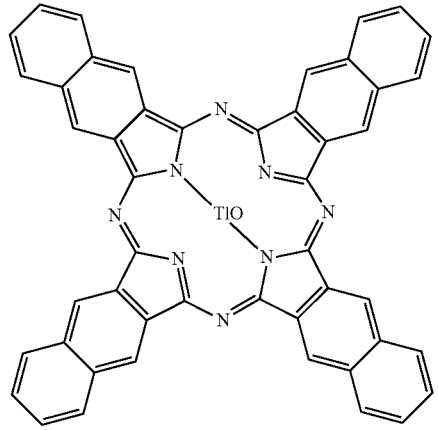

No.3

-continued
No.4
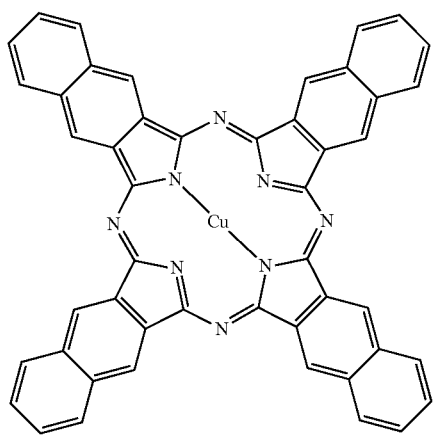
No.5
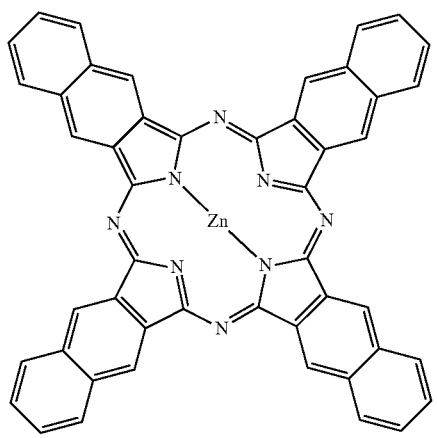
No.6
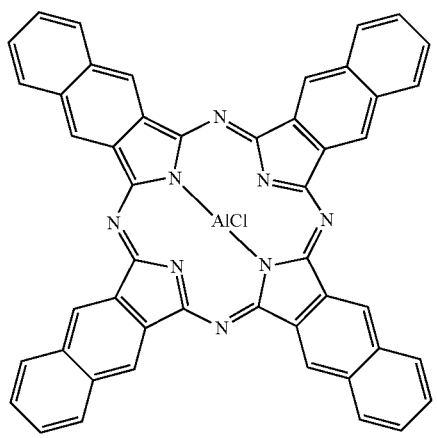
-continued
No.7
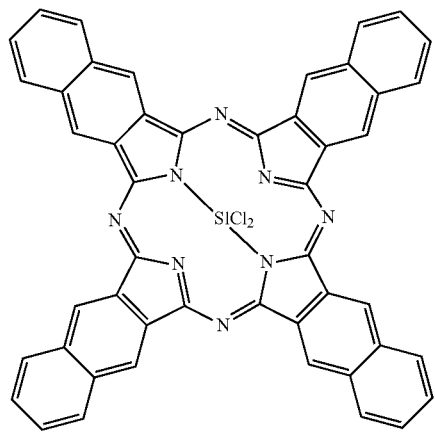
No.8
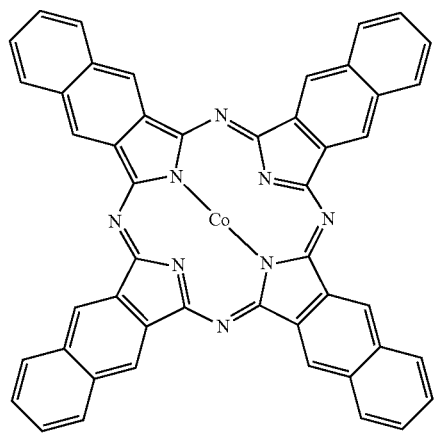
No.9
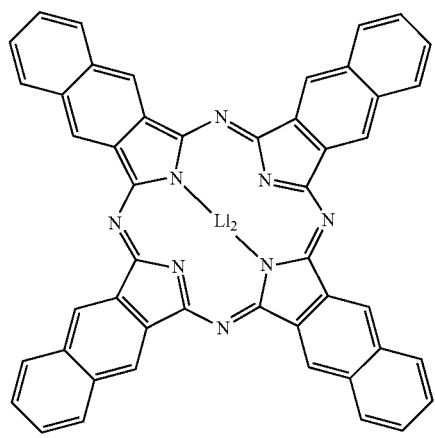

No.10
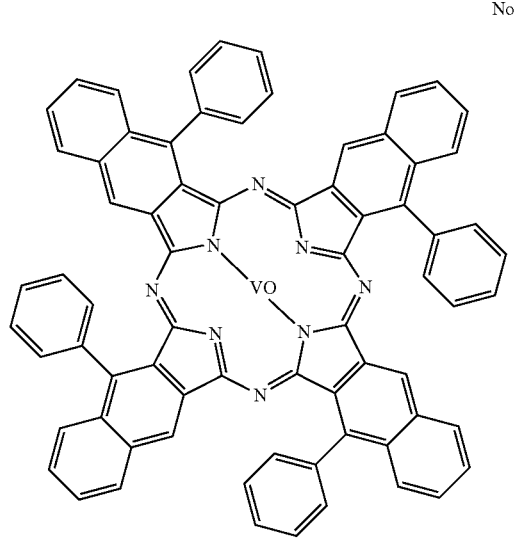
No.11
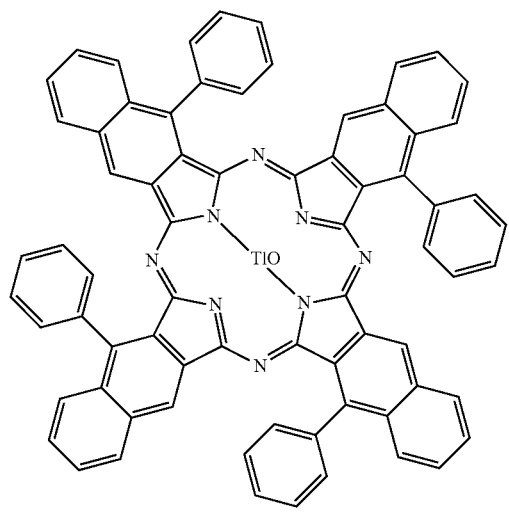
No.12
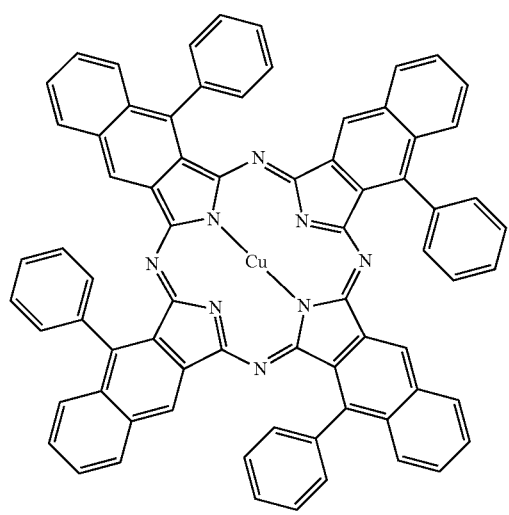
No.13
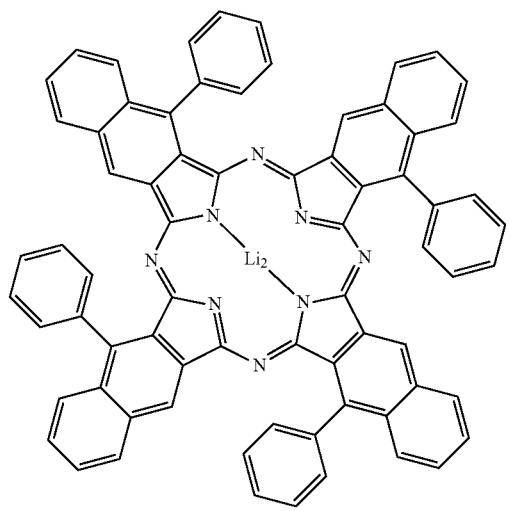
No.14
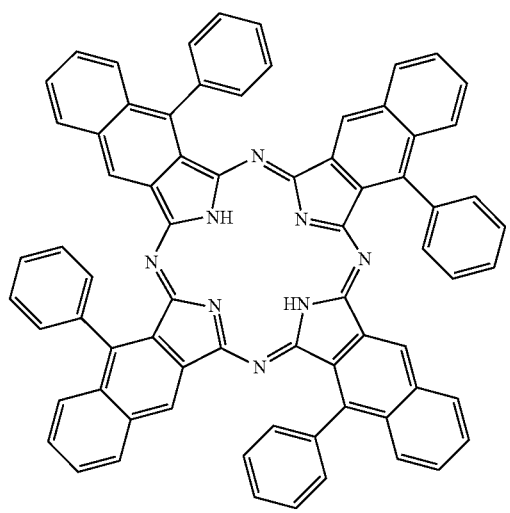
No.15
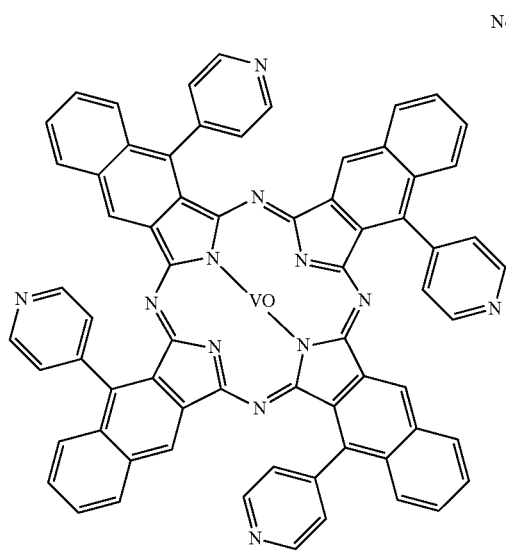

No.16
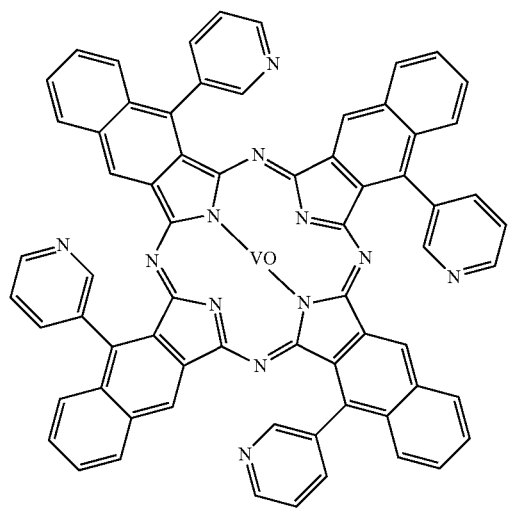
No.17
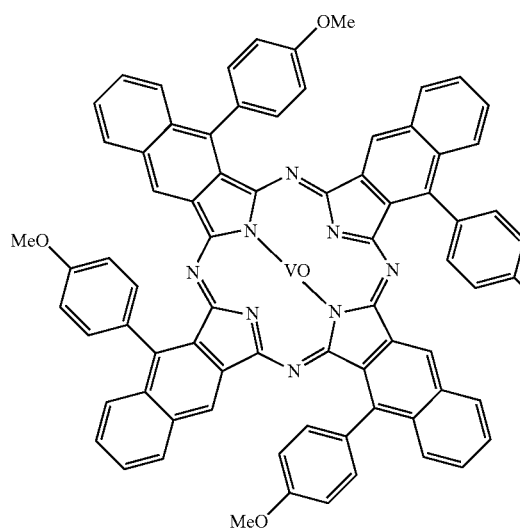
No.18
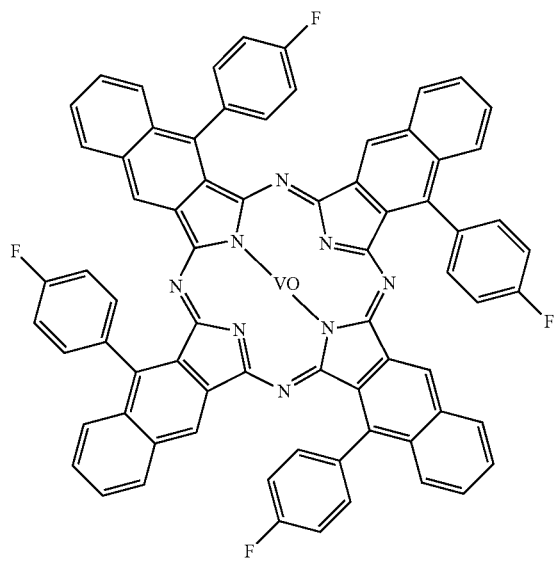
No.19
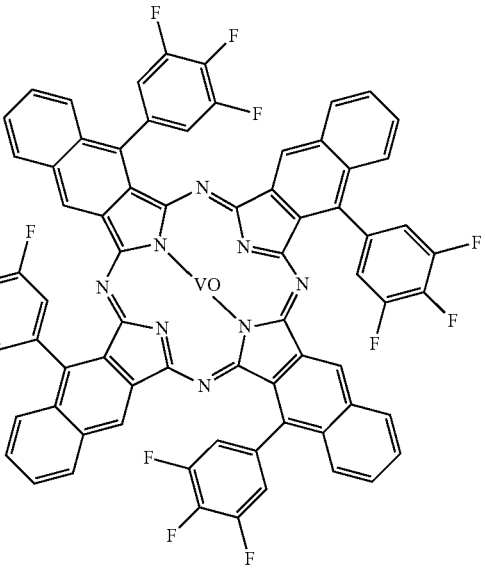
No.20
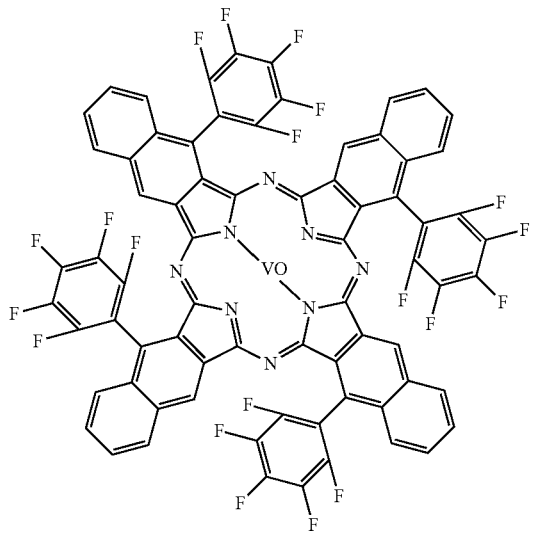
No.21
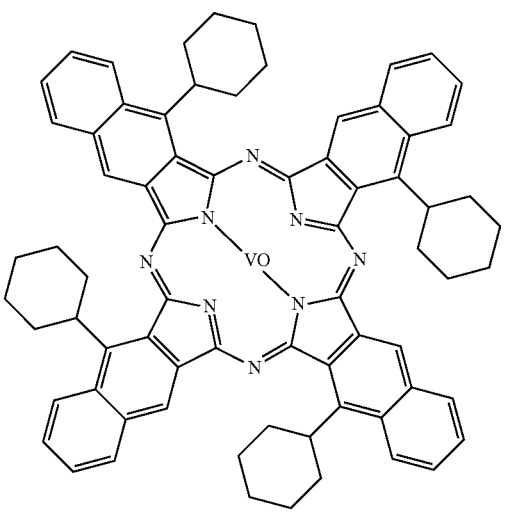

No.22
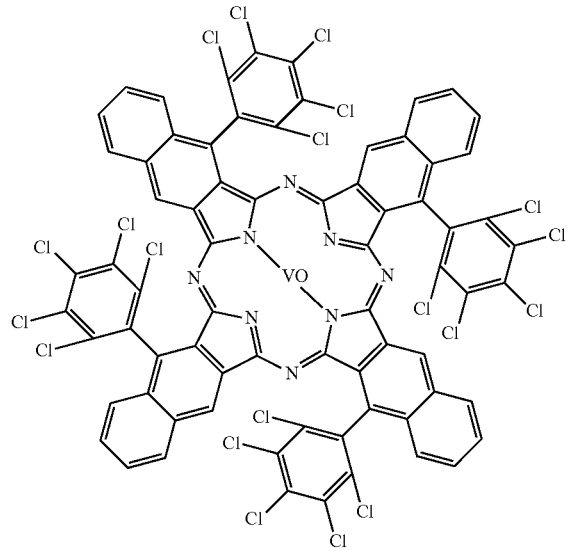
No.23
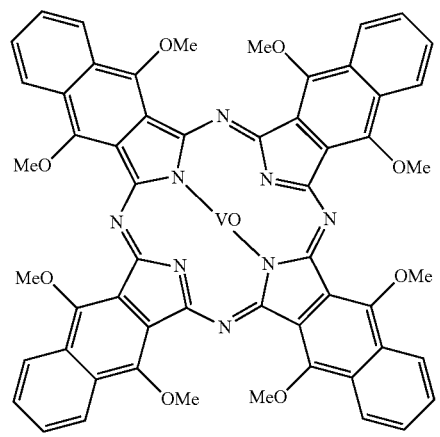
No.24
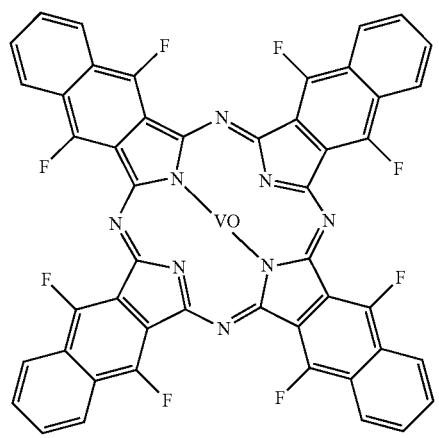
No.25
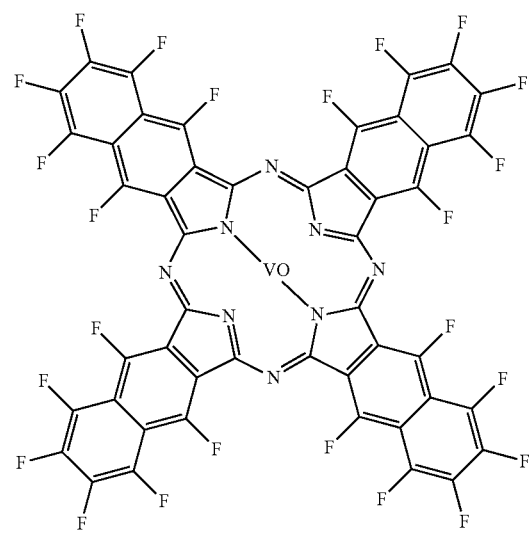
No.26
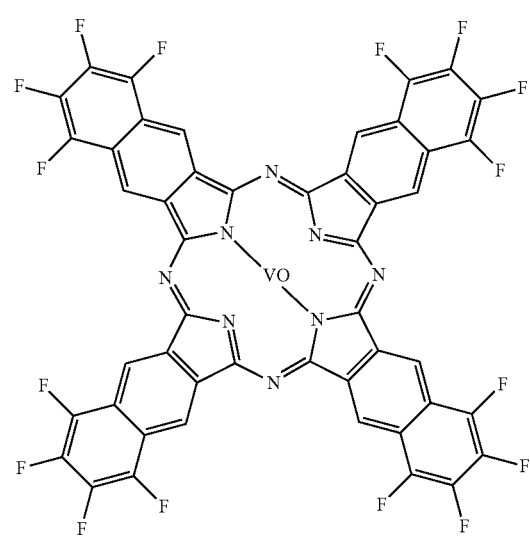
No.27
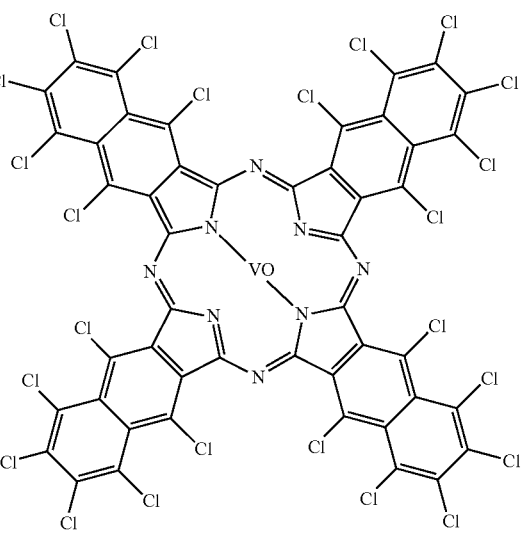

-continued
No.28
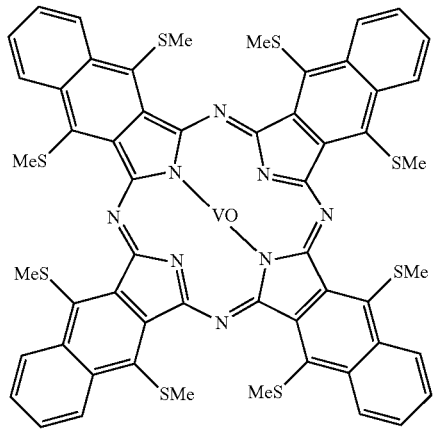
No.29
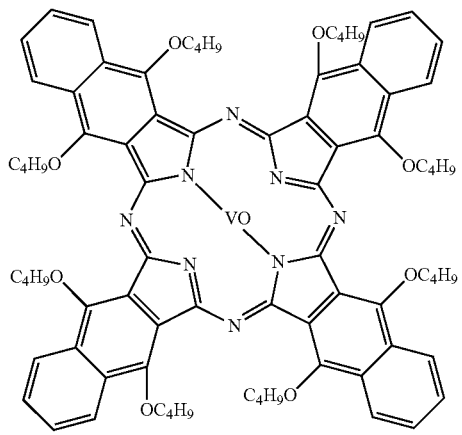
No.30
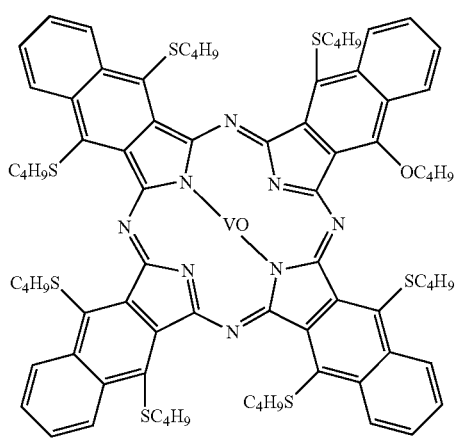
-continued
No.31
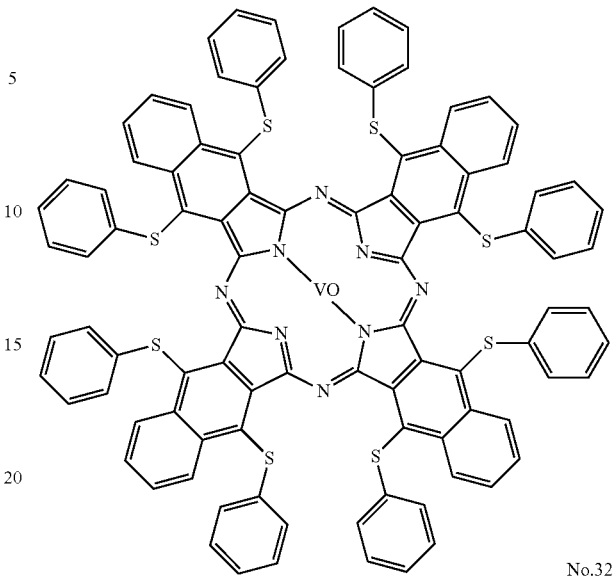
No.32
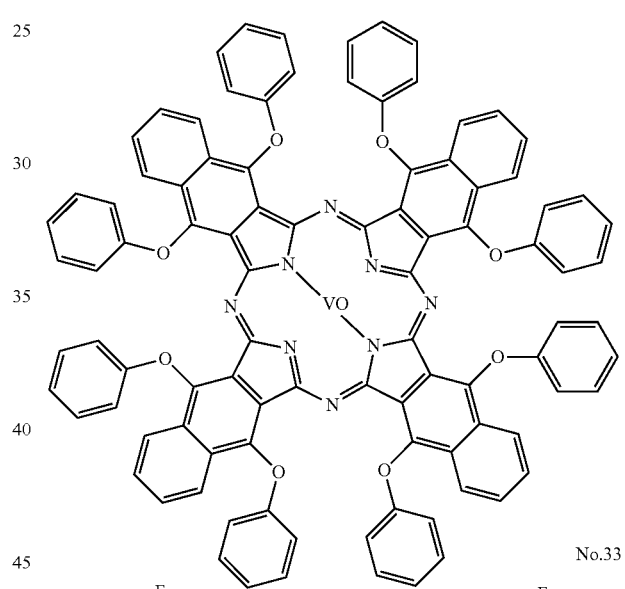
No.33
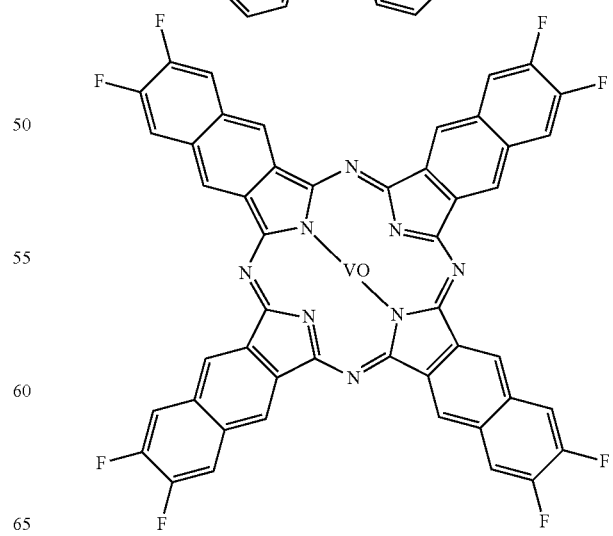

No.34
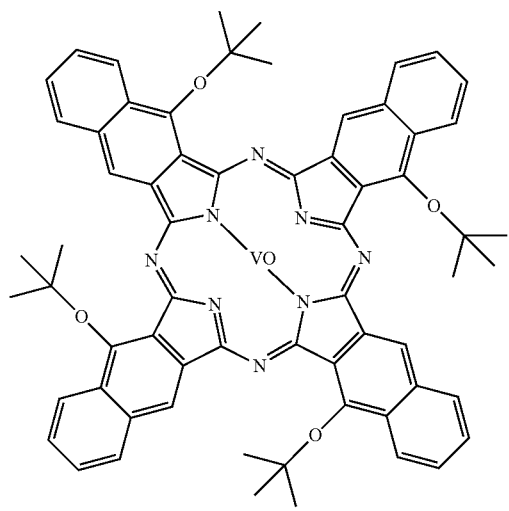
No.35
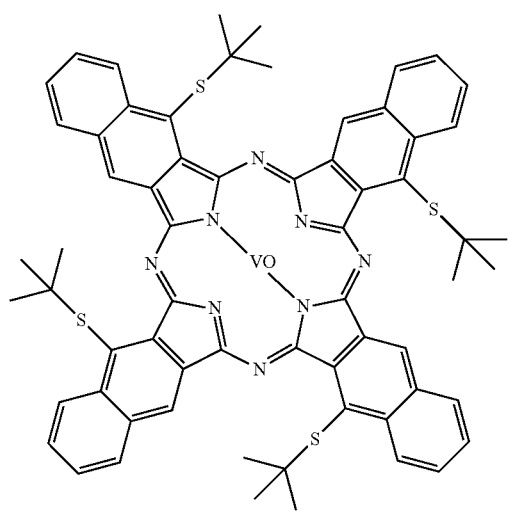
No.36
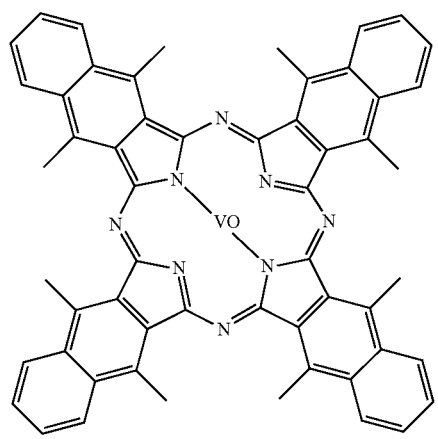
No.37
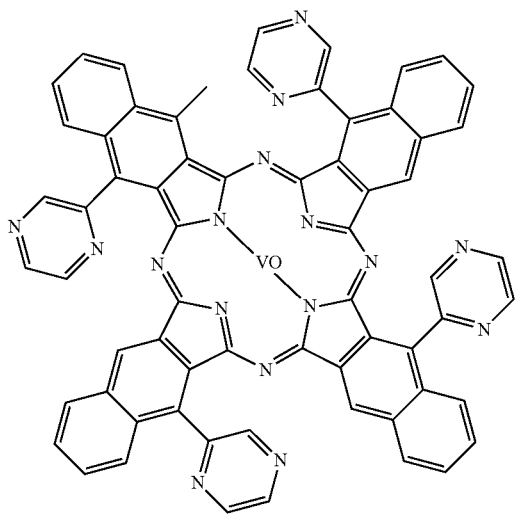
No.38
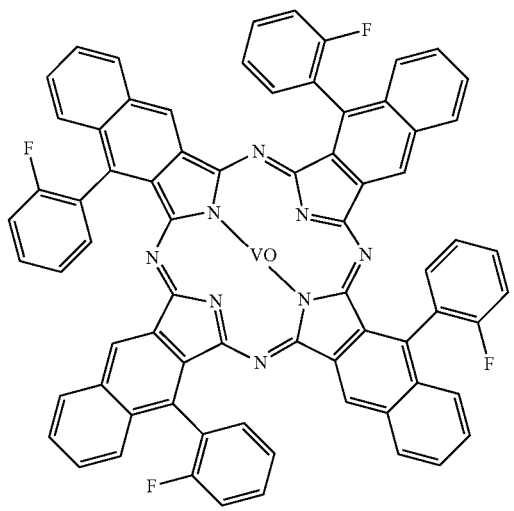
No.39
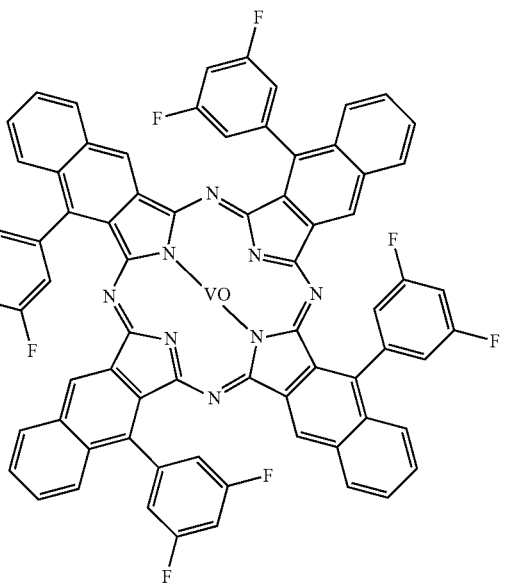

No.40

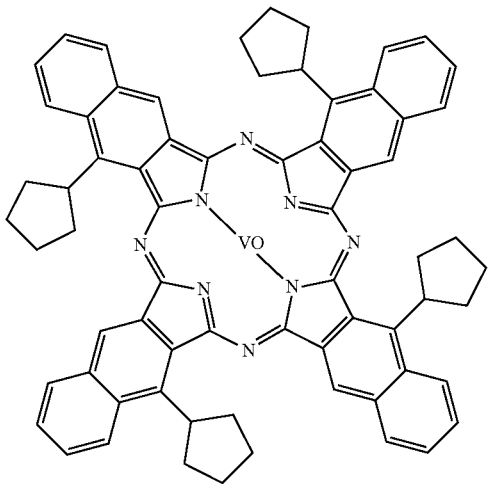

No.41

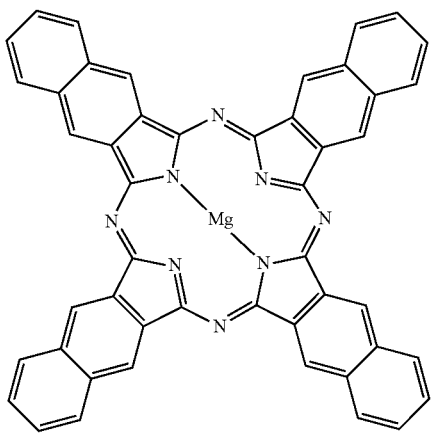

The naphthalocyanine compound represented by the formula (1) may be used alone or in combination of plural kinds.

The naphthalocyanine compound represented by the formula (1) has a maximum absorption wavelength in a wavelength region of, preferably 750 to 1500 nm, and more preferably 780 to 1000 nm.

The oil-soluble organic solvent or the aqueous medium contained in the pigment dispersion liquid of the present invention is not particularly limited as long as it can maintain dispersion stability when producing the pigment dispersion liquid.

Specific examples of the oil-soluble organic solvent include benzenes such as toluene and xylene, cellosolves such as methyl cellosolve, ethyl cellosolve, and butyl cellosolve, cellosolve acetatess such as methyl cellosolve acetate, ethyl cellosolve acetate, and butyl cellosolve acetate, propylene glycol monoalkyl ether acetates such as propylene glycol monomethyl ether acetate, propylene glycol monoethyl ether acetate, and propylene glycol monobutyl ether acetate, propionic acid esters such as methyl methoxypropionate, ethyl methoxypropionate, methyl ethoxypropionate, and ethyl ethoxypropionate, lactic acid esters such as methyl lactate, ethyl lactate, and butyl lactate, diethylene glycols such as diethylene glycol monomethyl ether and diethylene glycol monoethyl ether, acetic acid esters such as methyl acetate, ethyl acetate, and butyl acetate, ethers such as dimethyl ether, diethyl ether, tetrahydrofuran, and dioxane, ketones such as acetone, methyl ethyl ketone, methyl butyl ketone, and cyclohexanone, and alcohols such as methanol, ethanol, butanol, isopropyl alcohol, and benzyl alcohol. Because some of the organic solvents mentioned here are not only oil-soluble but also water-soluble, they are also mentioned as specific examples of the following aqueous media.

Specific examples of the aqueous medium contained in the pigment dispersion liquid of the present invention include alcohols such as methanol, ethanol, propanol, isopropanol, butanol, isobutanol, t-butanol, pentanol, and benzyl alcohol; polyhydric alcohols such as ethylene glycol, diethylene glycol, triethylene glycol, propylene glycol, polyethylene glycol, polypropylene glycol, glycerin, trimethylolpropane, 1,3-pentanediol, and 1,5-pentanedial; glycol derivatives such as ethylene glycol monomethyl ether, ethylene glycol monoethyl ether, diethylene glycol monomethyl ether, diethylene glycol monobutyl ether, triethylene glycol monoethyl ether, triethylene glycol monobutyl ether, and dipropylene glycol monomethyl ether; amines such as ethanolamine, diethanolamine, triethanolamine, and morpholine; and 2-pyrrolidone, NMP, and 1,3-dimethyl-imidazolidinone.

These oil-soluble organic solvents or aqueous mediums may be used alone or in combination of two or more. The amount of the oil-soluble organic solvent or the aqueous medium to be used is preferably 40 to 10,000 parts by mass, and more preferably 50 to 1000 parts by mass, with respect to 100 parts by mass of the total solid content of the pigment dispersion liquid.

The pigment dispersion liquid of the present invention may contain a dispersant. When the pigment dispersion liquid contains the dispersant, it can provide an improvement in the dispersibility of the pigment. Examples of the dispersant include a dye-based dispersant, a resin-based dispersant, and a surfactant and the like which have good adsorbability to a pigment.

As a dispersion method using the dye-based dispersant, for example, a method for mixing a sulfonate of an organic pigment, a carboxylate of an organic pigment, or a metal salt thereof with a pigment, and a method for mixing a substituted aminomethyl derivative with a pigment, and the like are known techniques.

Examples of the resin type dispersant and surfactant include cationic surfactants such as an organosiloxane polymer, KP341 (manufactured by Shin-Etsu Chemical Co., Ltd.), and (meth)acrylic acid-based (co) polymers, Polyflow No. 75, No. 90, No. 95 (manufactured by Kyoeisha Chemical Industry Co., Ltd.), nonionic surfactants such as a polyoxyethylene lauryl ether, a polyoxyethylene stearyl ether, a polyoxyethylene oleyl ether, a polyoxyethylene octyl phenyl ether, a polyoxyethylene nonyl phenyl ether, a polyethylene glycol dilaurate, a polyethylene glycol distearate, and a sorbitan fatty acid ester, anionic surfactants such as W004, W005, W017 (manufactured by Yusho Co., Ltd.), polymer dispersants such as EFKA-46, EFKA-47, EFKA-47EA, EFKA Polymer 100, EFKA Polymer 400, EFKA Polymer 401, and ETKA Polymer 450 (all manufactured by Ciba Speciality Chemical), and Disperse Aid 6, Disperse Aid 8, Disperse Aid 15, and Disperse Aid 9100 (all manufactured by San Nopco), Adeka Pluronics L31, F38, L42, L44, L61, L64, F68, L72, P95, F77, P84, P87, P94, L101, P103, F108, L121, and P-123 (manufactured by Asahi Denka Co., Ltd.) and Isonet S-20 (manufactured by Sanyo Chemical Industries, Ltd.), Disperbyks 101, 103, 106, 108, 109, 111, 112, 116, 130, 140, 142, 162, 163, 164, 166, 167, 170, 171, 174, 176, 180, 182, 2000, 2001, 2050, and 2150 (manufactured by BYK Chemie), Ajispers PB711, PB411, PB111, PB814, PB821, 822, 824, and 881 (manufactured by Ajinomoto Fine-Techno Co., Ltd.), and Solsperses 5000, 13240, 20000, 24000, 26000, 28000, and 71000 (manufactured by Avecia). Other examples of the dispersants include oligomers or polymers having a polar group at its molecular terminal or side chain, such as acrylic copolymers.

The content of the dispersant in the pigment dispersion liquid is not particularly limited, but it may be 0 to 70 parts by mass, and preferably 3 to 40 parts by mass with respect to 100 parts by mass of the total solid content.

The colored resin composition of the present invention contains, as essential components, a specific organic color pigment, an infrared absorbing dye having a maximum absorption wavelength in a wavelength region of 750 to 2000 nm, an oil-soluble organic solvent or an aqueous medium, and a photopolymerizable monomer. The colored resin composition of the present invention may contain various optional components such as a dispersant, a binder resin, and a dispersing aid, but the optional components are not limited thereto.

The photopolymerizable monomer contained in the colored resin composition of the present invention is a compound having a polymerizable group which can be polymerized by light irradiation, and the polymerizable group is not particularly limited as long as it is a group contributing to polymerization. The photopolymerizable monomer is preferably an acrylate monomer having photopolymerizability from the viewpoint of the design of a photolithography method. The acrylate monomer is not particularly limited, but an acrylate monomer having a molecular weight of 2000 or less is more preferable, and an alkylene oxide-modified acrylate monomer is particularly preferable, from the viewpoints of good developability and fine pattern formation property.

The "alkylene oxide-modified acrylate monomer" referred to herein means a compound having an alkylene oxide structure (i.e. a structure in which an alkylene group and an oxygen atom are bonded) and an acrylate group or a methacrylate group and having a weight average molecular weight of 3000 or less.

Specific examples of the acrylate monomer include Aronixes M-309, M-310, M-321, M-350, M-360, M-313, M-315, M-306, M-305, M-303, M-452, M-450, M-408, M-403, M-400, M-402, M-404, M-406, M-405, M-460, and M-510 (manufactured by Toagosei Co., Ltd.), NK ESTER, A-9300, A-9300-ICL, A-GLY-3E, A-GLY-9E, A-GIN-20E, TMPT, A-TMM-3, A-TMM-3L, A-TMM-3LM-N, A-TMPT, AD-TMP, ATM-35E, A-TMMT, A-9550, A-DPH, U-4HA, U-6HA, U-6LPA, UA-1100H, UA-53H, and UA-33H (manufactured by Shin-Nakamura Chemical Co., Ltd.), Kayarads TMPTA, TPA-330, D-310, T-1420(T), GPO-303, DPHA-40H, PET-30, DPEA-12, FM-700, DPHA, THE-330, RP-1040, DPCA-20, DPCA-30, DPCA-60, DPCA-120, CCR-129H, LAR-1035, IFR-1491H, LCR-1569H, UXE-3000, and UXE-3024 (manufactured by Nippon Kayaku Co., Ltd.).

Specific examples of the alkylene oxide-modified acrylate monomer include Aronixes M-310, M-321, M-350, M-360, M-313, M315, and M-460 (manufactured by Toagosei Co., Ltd.), NK ESTER, A-9300, ATM-35E, A-GLY-3E, A-GLY-9E, and A-GLY-20E (manufactured by Shin-Nakamura Chemical Co., Ltd.), and Kayarads TPA-330, GPO-303, THE-330, and RP-1040 (manufactured by Nippon Kayaku Co., Ltd.).

The content of the photopolynierizable monomer in the colored resin composition of the present invention can be optionally determined without particular limitation as long as a cured film can be formed by exposing a colored resin composition film obtained by removing a solvent after applying the colored resin composition to a substrate. Specifically, it is usually 1 to 80 parts by mass, and preferably 10 to 50 parts by mass, with respect to 100 parts by mass of the total solid content of the colored resin composition excluding the oil-soluble organic solvent and the aqueous medium.

A photopolymerization initiator may be used in combination with other components in the colored resin composition of the present invention. The photopolymerization initiator is preferably an aminoalkylphenone-based photopolymerization initiator or an oxime-based photopolymerization initiator. Specific examples of the aminoalkylphenone-based photopolymerization initiator include methyl 4-dimethylaminobenzoate, isoamyl 4-dimethylaminobenzoate, 2-dimethylaminoethyl benzoate, 2-ethyhexyl 4-dimethylaminobenzoate, 4,4'-bis(dimethylaminobenzophenone), 4,4'-bis(ethylmethylamino)benzophenone, IRGACUREs 369, 379, 379EG, and 907, KAYACURE EPA (manufactured by Nippon Kayaku Co., Ltd.), EAB-F (manufactured by Hodogaya Chemical Co., Ltd.). Specific examples of the oxime-based photopolymerization initiator include IRGACUREs OXE-01, OXE-02, PAG103, PAG121, and PAG203 (manufactured by BASF).

The content of the photopolymerization initiator in the colored resin composition of the present invention can be optionally determined without particular limitation as long as a cured film can be formed by exposing a colored resin composition film obtained by removing a solvent after applying the colored resin composition to a substrate. Specifically, it is usually 0.5 to 50 parts by mass, and preferably 1 to 25 parts by mass with respect to 100 parts by mass of the total solid content of the colored resin composition excluding the oil-soluble organic solvent and the aqueous medium.

The colored resin composition of the present invention may contain a dispersant.

Examples of the dispersant which can be used in combination with the colored resin composition of the present invention include the same as the above-mentioned dispersants which can be used for the pigment dispersion liquid.

The content of the dispersant in the colored resin composition is not particularly limited, but it may be 0 to 70 parts by mass, and preferably 3 to 40 parts by mass with respect to 100 parts by mass of the total solid content.

The colored resin composition of the present invention may contain a binder resin. It is desirable that the binder resin is soluble in an alkaline developing solution used in a development processing step from the viewpoint of the design of a photolithography method used for producing the color filter and the infrared cut filter of the present invention. It is desirable that the binder resin further has sufficient curing characteristics with a photopolymerization initiator and a photopolymerizable monomer and the like in order to form a good fine pattern.

As the binder resin, a known resin can be used. The binder resin is more preferably a copolymer comprised of an ethylenically unsaturated monomer having one or more carboxyl groups or hydroxyl groups listed below, or a copolymer comprised of an ethylenically unsaturated monomer having other copolymerizable aromatic hydrocarbon group or aliphatic hydrocarbon group. Binder resins having an epoxy group at the side chain or terminal thereof, and epoxy acrylate resins obtained by further adding an acrylate can also be used. These monomers and the like may be used alone or in combination of two or more.

Specific examples of the carboxyl group-containing ethylenically unsaturated monomer which can be used in the present invention include unsaturated monocarboxylic acids such as acrylic acid, methacrylic acid, crotonic acid, α-chloroacrylic acid, ethacrylic acid, and cinnamic acid, unsaturated dicarboxylic acids (anhydrides) such as maleic acid, maleic anhydride, fumaric acid, itaconic acid, itaconic anhydride, citraconic acid, citraconic anhydride, and mesaconic acid, trivalent or higher unsaturated polyvalent carboxylic acids (anhydrides), 2-(meth)acryloyloxyethyl hexahydrophthalic acid, 2-(meth)acryloyloxyethyl 2-hydroxypropyl phthalate, and 2-acryloyloxyethyl 2-hydroxyethyl phthalic acid. These can be used alone or in admixture of two or more.

Specific examples of the hydroxyl group-containing ethylenically unsaturated monomer which can be used in the present invention include hydroxyl group-terminated polyalkylene glycol mono(meth)acrylates such as 2-hydroxyethyl(meth)acrylate, 2-hydroxypropyl(meth)acrylate, 3-hydroxypropyl(meth)acrylate, 4-hydroxybutyl(meth)acrylate, 3-hydroxybutyl(meth)acrylate, 5-hydroxypentyl(meth)acrylate, 4-hydroxypentyl(meth)acrylate, 3-hydroxypentyl(meth)acrylate, 6-hydroxyhexyl(meth)acrylate, 5-hydroxyhexyl(meth)acrylate, 4-hydroxyhexyl(meth)acrylate, 5-hydroxy-3-methyl-pentyl(meth)acrylate, cyclohexane-1,4-dimethanol-mono(meth)acrylate, 2-(2-hydroxyethyloxy)ethyl(meth)acrylate, glycerin monomethacrylate, polyethylene glycol mono(meth)actylate, polypropylene glycol mono(meth)acrylate, and polyethylene glycol-propylene glycol) monomethacrylate. These can be used alone or in admixture of two or more.

Examples of the other copolymerizable ethylenically unsaturated monomer include aromatic vinyl compounds such as styrene, α-methylstyrene, o-vinyltoluene, m-vinyltoluene, p-vinyltoluene, o-chlorostvrene, m-chlorostyrene, p-chlorostyrene, and p-methoxystyrene, unsaturated carboxylic acid esters such as methyl(meth)actylate, ethyl(meth)acrylate, n-propyl(meth)acrylate, i-propyl(meth)acrylate, n-butyl(meth)acrylate, i-butyl(meth)acrylate, sec-butyl (meth)acrylate, t-butyl(meth)acrylate, 2-hydroxyethyl (meth)acrylate, benzyl(meth)acrylate, paracumylphenoxyethylene glycol(meth)acrylate, 2-hydroxy-3-phenoxypropyl (meth)acrylate, o-phenylphenol glycidyl ether(meth)acrylate, o-phenylphenol(meth)acrylate hydroxyethylate, and phenoxyethyl(meth)acrylate, alicyclic compounds such as cyclopentyl(meth)acrylate, cyclohexyl(meth)acrylate, trimethylcyclohexyl(meth)acrylate, norbomyl(meth)acrylate, norbornylmethyl(meth)acrylate, phenylnorbonyl(meth) acrylate, cyanonorbomyl(meth)acrylate, isobornyl(meth) acrylate, bornyl(meth)acrylate, menthyl(meth)acrylate, fenchyl(meth)acrylate, adamantly(meth)acrylate, dimethyladamantyl(meth)acrylate, tricyclo[5.2.1.0$^{2,6}$]deca-8-yl=(meth)acrylate, tricyclo[5.2.1.0$^{2,6}$]deca-4-methyl=(meth) acrylate, cyclodecyl(meth)acrylate, 2-(meth) acryloyloxyethylhexahydrophthalic acid, and tert-butylcyclohexyl(meth)acrylate, hydroxy group-terminated polyalkylene glycol mono(meth)acrylates such as polyethylene glycol mono(meth)acrylate, polypropylene glycol mono(meth)acrylate, and poly(ethylene glycol-propylene glycol)monomethacrylate, alkyl-terminated polyalkylene glycol mono (meth)acrylates such as methoxy polyethylene glycol monomethacrylate, lauroxy polyethylene glycol mono(meth)acrylate, octoxy polyethylene glycol polypropylene glycol mono(meth)acrylate, nonyl phenoxy polyethylene glycol monoacrylate, nonyl phenoxy polypropylene glycol monoacrylate, and allyloxy polyethylene glycolpolypropylene glycol mono(meth)acrylate, unsaturated carboxylic acid aminoalkyl esters such as 2-aminoethyl acrylate, 2-aminoethyl methacrylate, 2-aminopropyl acrylate, 2-aminopropyl methacrylate, 3-aminopropyl acrylate, and 3-aminopropyl methacrylate, unsaturated carboxylic acid glycidyl esters such as glycidyl acrylate, glycidyl methacrylate, 3,4-epoxybutyl(meth)acrylate, (3,4-epoxycyclohexyl)methyl(meth)acrylate, and 4-hydroxybutyl(meth)acrylate glycidyl ether, carboxylic acid vinyl esters such as vinyl acetate, vinyl propionate, vinyl butyrate, and vinyl benzoate, unsaturated ethers such as vinyl methyl ether, vinyl ethyl ether, allyl glycidyl ether, and methallyl glycidyl ether, vinyl cyanide compounds such as acrylonitrile, methacrylonitrile, α-chloroacrylonitrile, and vinylidene cyanide, unsaturated amides or unsaturated imides such as acrylamide, methacrylamide, α-chloroacrylamide, N-phenylmaleimide, N-cyclohexylmaleimide, N-(meth)acryloylphthalimide, N-(2-hydroxyethyl)acrylamide, N-(2-hydroxyethyl)methacrylamide, and maleimide, aliphatic conjugated dienes such as 1,3-butadiene, isoprene, and chloroprene, and rnacromonomers having a monoacryloyl group or a monomethacryloyl group at the terminal of a polymer molecular chain such as polystyrene, polymethyl acrylate, polymethyl methacrylate, poly(n-butyl acrylate), poly(n-butyl methacrylate), and polysilicone. These can be used alone or in admixture of two or more.

A polymer having an unsaturated double bond introduced into the side chain of a copolymer is also useful. Examples thereof include a half-esterified compound obtained by reacting an acrylate having an alcoholic hydroxyl group such as hydroxyethyl acrylate or an acrylate having an epoxy group such as glycidyl methacrylate with a maleic anhydride portion of a copolymer of maleic anhydride and copolymerizable styrene, vinylphenol, acrylic acid, acrylic acid ester, and acrylamide and the like, and a compound obtained by reacting acrylic acid with a hydroxyl group of a copolymer of acrylic acid or an acrylic acid ester and an acrylate having an alcoholic hydroxyl group such as hydroxyethyl acrylate. Urethane resins, polyamides, polyimide resins, polyester resins, commercially available ACA-200M (manufactured by Daicel), ORGA-3060 (manufactured by Osaka Organic Chemical Industry Co., Ltd.), AX3-BNX02 (manufactured by Nippon Shokubai Co., Ltd.), UXE-3024 (manufactured by Nippon Kayaku Co., Ltd.), UXE-3000 (manufactured by Nippon Kavaku Co., Ltd.), LGA-287H (manufactured by Nippon Kayaku Co., Ltd.), TCR-13381-1 (manufactured by Nippon Kayaku Co., Ltd.), ZXR-1722H (manufactured by Nippon Kayaku Co., Ltd.), MR-1401H (manufactured by Nippon Kayaku Co., Ltd.), and ZCR-1642 (manufactured by Nippon Kayaku Co., Ltd.) can also be used.

When the binder resin (copolymer) used in the present invention is produced, a polymerization initiator may be used. Specific examples of the polymerization initiator used when the copolymer is synthesized here include α,α'-azobis (isobutyronitrile), 2,2'-azobis(2-methylbutyronitrile), t-butyl peroctoate, and di-t-butyl peroxide, benzoyl peroxide, methyl ethyl ketone peroxide. The ratio of the polymerization initiator is usually 0.01 to 25 parts by mass with respect to the total of all monomers used for synthesizing the copolymer. When a copolymer is synthesized, it is preferable to use an organic solvent described below. The organic solvent desirably has sufficient properties dissolving monofunctional monomers, polymerization initiators or the like to be used. A reaction temperature when the copolymer is synthesized is preferably 50 to 120° C., and particularly preferably 80 to 100° C. A reaction time is preferably 1 to 60 hours, and more preferably 3 to 20 hours. The acid value of the copolymer is preferably 10 to 300 (mg KOH/g), and the hydroxyl value thereof is preferably 10 to 200 (mg KOH/g). When the acid value or the hydroxyl value is 10 or more, developability can be kept at an appropriate level. The weight average molecular weight (Mw) of the copolymer is preferably 2,000 to 400,000, and more preferably 3,000 to 100,000, When the weight average molecular weight is 2000 or more and 400000 or less, sensitivity and developability and the like can be kept at an appropriate level.

In the present invention, the binder resins can be used alone or in admixture of two or more. The content of the binder resin in the present invention is usually 0.5 to 99 parts by mass, and preferably 5 to 50 parts by mass, with respect to 100 parts by mass of the total solid content of the colored resin composition. In this case, when the content of the binder resin is 0.5 parts by mass or more, alkaline developability can be properly maintained, and the probability of occurrence of a problem such as scumming or residual film in a region other than a portion where the pixel is formed can be suppressed.

The method for preparing the pigment dispersion liquid of the present invention is not particularly limited, but for example, the pigment dispersion liquid can be obtained by finely dispersing the organic pigment, the infrared absorbing dye, the dispersant, and the oil-soluble organic solvent or the aqueous medium with beads made of glass or zirconia and the like having a particle size of 0.01 to 1 mm using a vertical or horizontal sand grinder, a pin mill, a slit mill, and an ultrasonic dispersing machine and the like.

The bead dispersion may also be preceded by kneading, while applying a strong shearing force using a double roll mill, three-roll mill, ball mill, trommel, disper, kneader, co-kneader, homogenizer, blender, single-screw or double-screw extruder and the like.

The time of kneading and dispersing treatment is not particularly limited, but it is preferably 1 hour or more, for example. Details of kneading and dispersion may be referred to description in T. C. Patton, "PaintFlow and Pigment Dispersion" (1964, published by John Wiley and Sons).

The colored resin composition of the present invention contains a binder resin, an organic solvent or an aqueous medium, a polymerizable monomer, and the pigment dispersion liquid. The colored resin composition may contain various additives such as a surfactant, a photopolymerization initiator, a thermal polymerization initiator, a polymerization inhibitor, and an ultraviolet absorber, if necessary without any particular limitation. Components other than the pigment dispersion liquid can be used without any particular limitation.

The colored resin composition of the present invention can be produced by mixing and stirring the binder resin, the organic solvent or the aqueous medium, the polymerizable monomer, and the pigment dispersion liquid and the like with a dissolver or a homomixer and the like.

If necessary, the colored resin composition of the present invention can be subjected to microfiltration with a filter and the like in order to remove foreign matters and the like after its preparation.

Next, the method for preparing a cured product (i.e. a color filter and an infrared cut filter) from the colored resin composition of the present invention will be described. First, the colored resin composition of the present invention is applied on a substrate such as a glass substrate or a silicon substrate so that a film thickness is set to 0.1 to 20 μm, and more preferably 0.5 to 5 μm by a method such as a spin coating method, a roll coating method, a slit-and-spin method, a die coating method, or a bar coating method, dried under a reduced pressure under drying conditions of a temperature of 23 to 150° C. and a time of 1 to 60 minutes, and more preferably a temperature of 60 to 120° C. and a time of 1 to 10 minutes in a reduced pressure chamber, if necessary, and subjected to a prebaking treatment with a hot plate or a clean oven and the like, to form a film. Next, a radiation (examples thereof include an electron beam and an ultraviolet ray, but the ultraviolet ray is preferable) is emitted through a predetermined mask pattern according to a general photolithography method, and development is performed using a surfactant aqueous solution, an alkaline aqueous solution, or a mixed aqueous solution of a surfactant and an alkaline agent. The developing method includes a dipping method, a spraying method, a showering method, a paddle method, and an ultrasonic developing method, but any of these methods may be used in combination. After an unexposed portion is removed by development, followed by rinsing with water, a post-baking treatment can be performed. By carrying out the post-baking treatment, for example, at a temperature of 130 to 300° C. for 1 to 120 minutes, and preferably at a temperature of 150 to 250° C. for 1 to 30 minutes, the cured film of the colored resin composition of the present invention can be obtained.

As the surfactant, a polyoxyethylene alkyl ether, a polyoxyalkylene alkyl ether and the like can be used. As the alkaline agent, sodium carbonate, potassium carbonate, sodium hydroxide, potassium hydroxide, diethanolamine, and tetramethylammonium hydroxide and the like are used. In the present invention, it is preferable to use an aqueous solution containing both an alkaline agent and a surfactant. Development may be carried out at a treatment temperature of usually 10 to 50° C., and preferably 20 to 40° C., for a treatment time of usually 30 to 600 seconds, and preferably 30 to 120 seconds.

The cured product of the colored resin composition of the present invention is useful as a filter having both a thin color filter function and near-infrared ray cut function suitable for a solid-state image sensing device used in a digital camera and the like. The optical filter has patterned pixels made of the cured product of the colored resin composition of the present invention prepared as described above.

The solid-state image sensing device of the present invention is constituted by using the colored resin composition containing the pigment dispersion liquid of the present invention and providing the filter having the functions of both the color filter and the near-infrared ray cut filter formed in one development step. Since the solid-state image sensing device of the present invention includes the above-described filter of the present invention, it is lightweight and has excellent image quality with reduced noise.

The optical filter obtained from the colored resin composition containing the pigment dispersion liquid of the present invention has the functions of both the color filter and the near-infrared ray cut filter, so that the thin single layer can be preferably provided without requiring the conventional two-layer configuration in the solid-state image sensing device. However, in one embodiment, the optical filter can also be used as a substitute for one layer of the conventional two-layer configuration.

EXAMPLES

Hereinafter, the present invention will be described in more detail by Examples. It should be noted that the present invention is not limited to these Examples. In Examples, "parts" means "parts by mass" unless otherwise specified.

In Examples, a mass spectrum was measured with LC-MS (Agilent 6100; manufactured by Agilent Technologies, Inc.), and a maximum absorption wavelength was measured with an ultraviolet-visible near-infrared spectrophotometer (UV-3150; manufactured by Shimadzu Corporation), respectively.

Synthesis Example 1

Synthesis of vanadyl 2,3-naphthalocyanine, i.e. the Compound Represented by No. 2 in the above Specific Illustration 70 parts of 2,3-naphthalene dicarboxylic acid anhydride, 125 parts of urea, 1.8 parts of ammonium molybdate, 15.3 parts of vanadium (V) trichloride oxide, and 450 mL of sulfolane were placed in a 2000-mL four-necked flask, and stirred at room temperature for 10 minutes to obtain a mixture. The mixture was heated and stirred at an internal temperature of 195 to 205° C. for 6 hours. The reaction liquid was cooled to room temperature, and 400 mL of pure water was added thereto. The precipitated solid was collected by filtration. The solid was placed in a 1000-mL four-necked flask, and 500 mL of N,N-dimethylformamide (abbreviated name: DMF) was further added thereto, followed by suspending to obtain a suspended product. The suspended product was heated and stirred at 100° C. for 1 hour. Thereafter, the inner temperature was cooled to 50° C., and the solid was collected by filtration. The obtained solid was dried to obtain 68.8 parts of the compound represented by No. 2 in the above specific illustration. The measurement results of the mass spectrum and the maximum absorption wavelength of the obtained compound were as follows.

Mass spectrum M+=779

Maximum absorption wavelength: 792 nm (N-methyl-2-pyrrolidone)

Synthesis Example 2

Synthesis of titanyl 2,3-naphthalocyanine, i.e. a Compound Represented by No. 3 in the above Specific Illustration 25 parts of 2,3-naphthalenedicarboxylic anhydride, 38 parts of urea, 0.2 parts of ammonium molybdate, 8.4 parts of titanium (W) chloride, and 200 mL of sulfolane were placed in a 500-mL four-necked flask, and stirred at room temperature for 10 minutes to obtain a mixture. The mixture was heated and stirred at an internal temperature of 195 to 205° C. for 6 hours. The reaction liquid was cooled to room temperature, and 100 mL of pure water was added thereto. The precipitated solid was collected by filtration. The solid was placed in a 500-mL four-necked flask, and 150 mL of N,N-dimethylformamide (abbreviated name: DMF) was further added thereto, followed by suspending to obtain a suspended product. The suspended product was heated and stirred at 100° C. for 1 hour. Thereafter, the inner temperature was cooled to 50° C., and the solid was collected by filtration. The obtained solid was dried to obtain 19.1 parts of a compound represented by No. 3 in the above specific illustration. The measurement results of the mass spectrum and the maximum absorption wavelength of the obtained compound were as follows.

Mass spectrum M+=776

Maximum absorption wavelength: 791 nm (N-methyl-2-pyrrolidone)

Synthesis Example 3

Synthesis of vanadyl-1-phenyl-2,3-naphthalocyanine, i.e. a Compound Represented by No. 10 in the above Specific Illustration 10 parts of 1-phenyl-2,3-naphthalene dicarboxylic anhydride, 13 parts of urea, 0.2 parts of ammonium molybdate, 1.6 parts of vanadium (V) trichloride oxide, and 100 mL of sulfolane were placed in a 500-mL four-necked flask, and stirred at room temperature for 10 minutes to obtain a mixture. The mixture was heated and stirred at an internal temperature of 195 to 205° C. for 6 hours. The reaction liquid was cooled to room temperature, and 100 mL of pure water was added thereto. The precipitated solid was collected by filtration. The solid was placed in a 500-mL four-necked flask, and 150 mL of N,N-dimethylformamide (abbreviated name: DMF) was further added thereto, followed by suspending to obtain a suspended product. The suspended product was heated and stirred at 100° C. for 1 hour. Thereafter, the inner temperature was cooled to 50° C., and the solid was collected by filtration. The obtained solid was dried to obtain 9.9 parts of a compound represented by No. 10 in the above specific illustration. The measurement results of the mass spectrum and the maximum absorption wavelength of the obtained compound were as follows.

Mass spectrum M+=1084

Maximum absorption wavelength: 808 nm(N-methyl-2-pyrrolidone)

Synthesis Example 4

Synthesis of zinc 2,3-naphthalocyanine, i.e. a Compound Rrepresented by No. 5 in the above Specific Illustration 18 parts of 2,3-dicyanonaphthalene, 9.4 parts of zinc chloride (II), and 150 mL of quinoline were placed in a 500-mL four-necked flask, and stirred at room temperature for 10 minutes to obtain a mixture. The mixture was heated and stirred at an internal temperature of 195 to 205° C. for 2 hours. The reaction liquid was cooled to room temperature, and 200 mL of pure water was added thereto. The precipitated solid was collected by filtration. The solid was placed in a 300-mL four-necked flask, and 100 mL of N,N-dimethylformamide (abbreviated name: DMF) was further added thereto, followed by suspending to obtain a suspended product. The suspended product was heated and stirred at 100° C. for 1 hour. Thereafter, the inner temperature was cooled to 50° C., and the solid was collected by filtration. The obtained solid was dried to obtain 5.2 parts of a compound represented by No. 5 in the above specific illustration. The measurement results of the mass spectrum and the maximum absorption wavelength of the obtained compound were as follows.

Mass spectrum M+=778

Maximum absorption wavelength: 759 nm (N-methyl-2-pyrrolidone)

Synthesis Example 5

Synthesis of magnesium 2,3-naphthalocyanine, i.e. a Compound Represented by No. 41 in the above Specific Illustration 18 parts of 2.3-dicyanonaphthalene, 9.4 parts of magnesium (II) acetate tetrahydrate, and 500 mL of isoamyl alcohol were placed in a 2000-mL four-necked flask, and stirred at room temperature for 10 minutes to obtain a mixture. The mixture was then heated and stirred under reflux for 10 hours. The reaction liquid was cooled to room temperature, and 500 mL of pure water was added thereto. The precipitated solid was collected by filtration. The solid was placed in a 300-mL four-necked flask, and 100 mL of N,N-dimethylformamide (abbreviated name: DMF) was further added thereto, followed by suspending to obtain a suspended product. The suspended product was heated and stirred at 100° C. for 1 hour. Thereafter, the inner temperature was cooled to 50° C., and the solid was collected by filtration. The obtained solid was dried to obtain 5.5 parts of a compound represented by No. 41 in the above specific illustration. The measurement results of the mass spectrum and the maximum absorption wavelength of the obtained compound were as follows.

Mass spectrum M+=737

Maximum absorption wavelength: 750 nm (N-methyl-2-pyrrolidone)

Example 1

Preparation of Pigment Dispersion Liquid 1 of the Present Invention

C.I. pigment red 254, pigment red 177, pigment yellow 139, the compound No. 2 obtained in Synthesis Example 1, Disperbyk-2001, propylene glycol monomethyl ether acetate (abbreviated name: PGMEA) were mixed at a composition ratio of 10.0/1.4/2.9/0.75/7.0/78.0 (mass ratio), and then dispersed with 0.3 mm zirconia beads to obtain pigment dispersion liquid 1 containing the compound No. 2, the pigment red, and the pigment yellow. The pigment dispersion liquid 1 stored at 23° C. for 1 week had good dispersion stability without forming a precipitate.

Example 2

Preparation of Pigment Dispersion Liquid 2 of the Present Invention

Pigment dispersion liquid 2 containing the compound No. 3, the pigment red, and the pigment yellow was obtained in the same manner as in Example 1 except that the compound No. 3 obtained in Synthesis Example 2 was used in place of the compound No. 2 obtained in Synthesis Example 1. The pigment dispersion liquid 2 stored at 23° C. for 1 week had good dispersion stability without forming a precipitate.

Example 3

Preparation of Pigment Dispersion Liquid 3 of the Present Invention

Pigment dispersion liquid 3 containing the compound No. 10, the pigment red, and the pigment yellow was obtained in the same manner as in Example 1 except that the compound No. 10 obtained in Synthesis Example 3 was used in place of the compound No. 2 obtained in Synthesis Example 1. The pigment dispersion liquid 3 stored at 23° C. for 1 week had good dispersion stability without forming a precipitate.

Example 4

Preparation of Pigment Dispersion Liquid 4 of the Present Invention

C.I. pigment blue 15:6, pigment violet 23, the compound No. 2 obtained in Synthesis Example 1, Disperbyk-2001, Solsperse 5000, PGMEA were mixed at a composition ratio of 11.4/2.9/0.75/6.0/1.0/78.0 (mass ratio), and then dispersed with 0.3 mm zirconia beads to obtain pigment dispersion liquid 4 containing the compound No. 2, the pigment blue, and the pigment violet. The pigment dispersion liquid 4 stored at 23° C. for 1 week had good dispersion stability without forming a precipitate.

Example 5

Preparation of Pigment Dispersion Liquid 5 of the Present Invention

Pigment dispersion liquid 5 containing the compound No. 3, the pigment blue, and the pigment violet was obtained in the same manner as in Example 4 except that the compound No. 3 obtained in Synthesis Example 2 was used in place of the compound No. 2 obtained in Synthesis Example 1. The pigment dispersion liquid 5 stored at 23° C. for 1 week had good dispersion stability without forming a precipitate.

Example 6

Preparation of Pigment Dispersion Liquid 6 of the Present Invention

Pigment dispersion liquid 6 containing the compound No. 10, the pigment blue, and the pigment violet was obtained in the same manner as in Example 4 except that the compound No. 10 obtained in Synthesis Example 3 was used in place of the compound No. 2 obtained in Synthesis Example 1. The pigment dispersion liquid 6 stored at 23° C. for 1 week had good dispersion stability without forming a precipitate.

Example 7

Preparation of Pigment Dispersion Liquid 7 of the Present Invention

C.I. pigment green 36, pigment yellow 150, the compound No. 2 obtained in Synthesis Example 1, Disperbyk-2001, Solsperse 5000, and PGMEA were mixed at a composition ratio of 10.0/4.3/0.75/6.0/1.0/78.0 (mass ratio), and then dispersed with 0.3 mm zirconia beads to obtain pigment dispersion liquid 7 containing the compound No. 2, the pigment green, and the pigment yellow The pigment dispersion liquid 7 stored at 23° C. for 1 week had good dispersion stability without forming a precipitate.

Example 8

Preparation of Pigment Dispersion Liquid 8 of the Present Invention

Pigment dispersion liquid 8 containing the compound No. 3, the pigment green, and the pigment yellow was obtained in the same manner as in Example 7 except that the compound No. 3 obtained in Synthesis Example 2 was used in place of the compound No. 2 obtained in Synthesis Example 1. The pigment dispersion liquid 8 stored at 23° C. for 1 week had good dispersion stability without forming a precipitate.

Example 9

Preparation of Pigment Dispersion Liquid 9 of the Present Invention

Pigment dispersion liquid 9 containing the compound No. 10, the pigment green, and the pigment yellow was obtained in the same manner as in Example 7 except that the compound No. 10 obtained in Synthesis Example 3 was used in place of the compound No. 2 obtained in Synthesis Example 1. The pigment dispersion liquid 9 stored at 23° C. for 1 week had good dispersion stability without forming a precipitate.

Example 10

Preparation of Pigment Dispersion Liquid 10 of the Present Invention

Pigment dispersion liquid 10 containing the compound No. 5 (ZnNc), the pigment red, and the pigment yellow was obtained in the same manner as in Example 1 except that the compound No. 5 obtained in Synthesis Example 4 was used in place of the compound No. 2 obtained in Synthesis Example 1. The pigment dispersion liquid 10 stored at 23° C. for 1 week had good dispersion stability without forming a precipitate.

Example 11

Preparation of Pigment Dispersion Liquid 11 of the Present Invention

Pigment dispersion liquid 11 containing the compound No. 41, the pigment red, and the pigment yellow was obtained in the same manner as in Example 1 except that the compound No. 41 obtained in Synthesis Example 5 was used in place of the compound No. 2 obtained in Synthesis Example 1. The pigment dispersion liquid 11 stored at 23° C. for 1 week had good dispersion stability without forming a precipitate.

Example 12

Preparation of Pigment Dispersion Liquid 12 of the Present Invention

Pigment dispersion liquid 12 containing the compound No. 5, the pigment blue, and the pigment violet was obtained in the same manner as in Example 4 except that the compound No. 5 obtained in Synthesis Example 4 was used in place of the compound No. 2 obtained in Synthesis Example 1. The pigment dispersion liquid 12 stored at 23° C. for 1 week had good dispersion stability without forming a precipitate.

Example 13

Preparation of Pigment Dispersion Liquid 13 of the Present Invention

Pigment dispersion liquid 13 containing the compound No. 41. the pigment blue, and the pigment violet was obtained in the same manner as in Example 4 except that the compound No. 41 obtained in Synthesis Example 5 was used in place of the compound No. 2 obtained in Synthesis Example 1. The pigment dispersion liquid 13 stored at 23° C. for 1 week had good dispersion stability without forming a precipitate.

Synthesis Example 6

Synthesis of a Binder Resin Referred to as Copolymer (A)

Into a 500-mL four-necked flask, 160 parts of methyl ethyl ketone, 10 parts of methacrylic acid, 33 parts of benzyl methacrylate, and 1 part of α,α'-azobis(isobutyronitrile) were charged, and nitrogen gas was made to flow into the flask for 30 minutes under stirring. Thereafter, the temperature was raised to 80° C., and the mixture was stirred as it was at 80 to 85° C. for 4 hours. After the completion of the reaction, the reaction mixture was cooled to room temperature to obtain a homogeneous copolymer solution being colorless and transparent. This was precipitated in a mixed solution containing isopropyl alcohol and water at a ratio of 1:1 to obtain a precipitate. The precipitate was filtered to obtain a solid content. The solid content was taken out and dried to obtain copolymer (A). The weight average molecular weight (measured by GPC) in terms of polystyrene of the obtained copolymer (A) was 18,000, and the acid value thereof was 152.

Example 14

Preparation of a Colored Resin Composition Containing Pigment Dispersion Liquid 1 and Copolymer (A)

3.0 parts of the copolymer (A) obtained in Synthesis Example 6 as a binder resin, 6.0 parts of Kayarad RP 1040 (manufactured by Nippon Kayaku Co., Ltd.) as a photopolymerizable monomer, 1.0 part of IRGACURE 907 (manufactured by BASF) and 1.0 part of IRGACURE OXE-02 (manufactured by BASF) as a photopolymerization initiator, 50 parts of the pigment dispersion liquid 1 obtained in Example 1 as a pigment dispersion liquid, and 39 parts of propylene glycol monomethyl ether acetate as a solvent were mixed to obtain colored resin composition 1 for an optical filter having the functions of both a red color filter and an infrared cut filter.

Example 15

Preparation of a Colored Resin Composition Containing Pigment Dispersion Liquid 2 and Copolymer (A)

Colored resin composition 2 of the present invention was obtained in the same manner as in Example 14 except that the pigment dispersion liquid 2 obtained in Example 2 was used in place of the pigment dispersion liquid 1 obtained in Example 1.

Example 16

Preparation of a Colored Resin Composition Containing Pigment Dispersion Liquid 3 and Copolymer (A)

Colored resin composition 3 of the present invention was obtained in the same manner as in Example 14 except that the pigment dispersion liquid 3 obtained in Example 3 was used in place of the pigment dispersion liquid 1 obtained in Example 1.

Example 17

Preparation of a Colored Resin Composition Containing Pigment Dispersion Liquid 4 and Copolymer (A)

Colored resin composition 4 for an optical filter having the functions of both a blue color filter and an infrared cut filter of the present invention was obtained in the same manner as in Example 14 except that the pigment dispersion liquid 4 obtained in Example 4 was used in place of the pigment dispersion liquid 1 obtained in Example 1.

Example 18

Preparation of a Colored Resin Composition Containing Pigment Dispersion Liquid 5 and Copolymer (A)

Colored resin composition 5 of the present invention was obtained in the same manner as in Example 14 except that the pigment dispersion liquid 5 obtained in Example 5 was used in place of the pigment dispersion liquid 1 obtained in Example 1.

Example 19

Preparation of a Colored Resin Composition Containing Pigment Dispersion Liquid 6 and Copolymer (A)

Colored resin composition 6 of the present invention was obtained in the same manner as in Example 14 except that the pigment dispersion liquid 6 obtained in Example 6 was used in place of the pigment dispersion liquid 1 obtained in Example 1.

Example 20

Preparation of a Colored Resin Composition Containing Pigment Dispersion Liquid 7 and Copolymer (A)

Colored resin composition 7 for an optical filter having the functions of both a green color filter and an infrared cut filter of the present invention was obtained in the same manner as in Example 14 except that the pigment dispersion liquid 7 obtained in Example 7 was used in place of the pigment dispersion liquid 1 obtained in Example 1.

Example 21

Preparation of a Colored Resin Composition Containing Pigment Dispersion Liquid 8 and Copolymer (A)

Colored resin composition 8 of the present invention was obtained in the same manner as in Example 14 except that the pigment dispersion liquid 8 obtained in Example 8 was used in place of the pigment dispersion liquid 1 obtained in Example 1.

Example 22

Preparation of a Colored Resin Composition Containing Pigment Dispersion Liquid 9 and Copolymer (A)

Colored resin composition 9 of the present invention was obtained in the same manner as in Example 14 except that the pigment dispersion liquid 9 obtained in Example 9 was used in place of the pigment dispersion liquid 1 obtained in Example 1.

Example 23

Preparation of a Colored Resin Composition Containing Pigment Dispersion Liquid 10 and Copolymer (A)

Colored resin composition 10 of the present invention was obtained in the same manner as in Example 14 except that the pigment dispersion liquid 10 obtained in Example 10 was used in place of the pigment dispersion liquid 1 obtained in Example 1.

Example 24

Preparation of a Colored Resin Composition Containing Pigment Dispersion Liquid 11 and Copolymer (A)

Colored resin composition 11 of the present invention was obtained in the same manner as in Example 14 except that the pigment dispersion liquid 11 obtained in Example 11 was used in place of the pigment dispersion liquid 1 obtained in Example 1.

Example 25

Preparation of a Colored Resin Composition Containing Pigment Dispersion Liquid 12 and Copolymer (A)

Colored resin composition 12 of the present invention was obtained in the same manner as in Example 14 except that the pigment dispersion liquid 12 obtained in Example 12 was used in place of the pigment dispersion liquid I obtained in Example 1.

Example 26

Preparation of a Colored Resin Composition Containing Pigment Dispersion Liquid 13 and Copolymer (A)

Colored resin composition 13 of the present invention was obtained in the same manner as in Example 14 except that the pigment dispersion liquid 13 obtained in Example 13 was used in place of the pigment dispersion liquid I obtained in Example 1.

Comparative Example 1

Preparation of Comparative Pigment Dispersion Liquid 14

Comparative pigment dispersion liquid 14 containing the pigment red and the pigment yellow was obtained in the same manner as in Example 1 except that the compound. No. 2 obtained in Synthesis Example 1 was not used.

Comparative Example 2

Preparation of Comparative Pigment Dispersion Liquid 15

Comparative pigment dispersion liquid 15 containing the pigment blue and the pigment violet was obtained in the same manner as in Example 4 except that the compound No. 2 obtained in Synthesis Example 1 was not used.

Comparative Example 3

Preparation of Comparative Pigment Dispersion Liquid 16

Comparative pigment dispersion liquid 16 containing pigment green and pigment yellow was obtained in the same manner as in Example 7 except that the compound No. 2 obtained in Synthesis Example 1 was not used.

Comparative Example 4

Preparation of a Colored Resin Composition Containing Comparative Pigment Dispersion Liquid 14 and Copolymer (A)

Comparative red colored resin composition 14 was obtained in the same manner as in Example 14 except that the pigment dispersion liquid 14 obtained in Comparative Example 1 was used in place of the pigment dispersion liquid 1 obtained in Example 1.

Comparative Example 5

Preparation of a Colored Resin Composition Containing Comparative Pigment Dispersion Liquid 15 and Copolymer (A)

Comparative blue colored resin composition 15 was obtained in the same manner as in Example 14 except that the pigment dispersion liquid 15 obtained in Comparative Example 2 was used in place of the pigment dispersion liquid 1 obtained in Example 1.

Comparative Example 6

Preparation of a Colored Resin Composition Containing Comparative Pigment Dispersion Liquid 16 and Copolymer (A)

Comparative green colored resin composition 16 was obtained in the same manner as in Example 14 except that the pigment dispersion liquid 16 obtained in Comparative Example 3 was used in place of the pigment dispersion liquid 1 obtained in Example 1.

Comparative Example 7

Preparation of Comparative Pigment Dispersion Liquid 17

C.I. pigment blue 15:6, pigment violet 23, the compound No. 2 obtained in Synthesis Example 1, Disperbyk-2001, Solsperse 5000. PGMEA, the compound A-33 described in JP-A-2012-77153 were mixed at a composition ratio of 11.4/1.5/0.75/6.0/1.0/78.0/1.4 (mass ratio), and then dispersed with 0.3 mm zirconia beads to obtain pigment dispersion liquid 17 containing the compound No. 2, the pigment blue, the pigment violet, and the compound A-33. The pigment dispersion liquid 17 gelated after being stored at 23° C. for 1 week, and had poor dispersion stability. It was found out that the addition of such a pyrromethene dye to the pigment dispersion liquid of the present invention caused deterioration in dispersion stability.

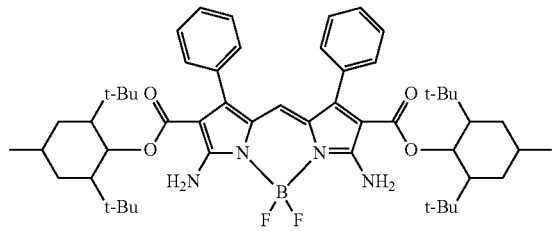

A-33

Comparative Example 8

Preparation of Comparative Pigment Dispersion Liquid 18

C.I. pigment blue 15:6, pigment violet 23, the compound 1-17 having the following structure (a typical example of a squarylium compound), Disperhyk-2001, Solspeace 5000, and PGMEA were mixed at a composition ratio of 11.4/2.9/0.75/6.0/1.0/78.0 (mass ratio), and then dispersed with 0.3 mm zirconia beads to obtain pigment dispersion liquid 18 containing the pigment blue, the pigment violet, and the compound 1-17.

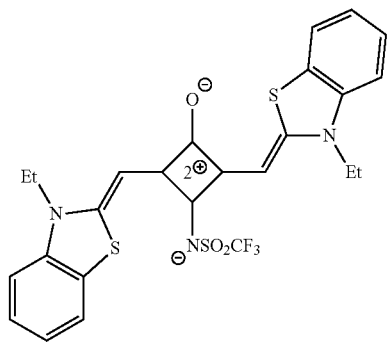

I-17

Comparative Example 9

Preparation of a Colored Resin Composition Containing Comparative Pigment Dispersion Liquid 18 and Copolymer (A)

Comparative blue colored resin composition 17 was obtained in the same manner as in Example 14 except that the pigment dispersion liquid 18 obtained in Comparative Example 8 was used in place of the pigment dispersion liquid 1 obtained in Example 1.

Comparative Example 10

Preparation of Comparative Pigment Dispersion Liquid 19

Comparative pigment dispersion liquid 19 was obtained in the same manner as in Comparative Example 8 except that a compound D-10 having the following structure (a typical example of a pyrrolopyrrole compound) was used in place of the compound 1-17 used in Comparative Example 8.

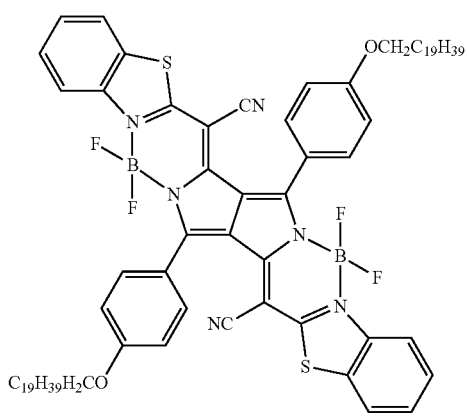

D-10

Comparative Example 11

Comparative blue colored resin composition 18 was obtained in the same manner as in Example 14 except that the pigment dispersion liquid 19 obtained in Comparative Example 10 was used in place of the pigment dispersion liquid 1 obtained in Example 1.

Comparative Example 12

C.I. pigment red 254, pigment red 177, pigment yellow 139, the compound D-10 having the above structure, Disperbyk-2001, and propylene glycol monomethyl ether acetate (abbreviated name: PGMEA) were mixed at a composition ratio of 10.0/1.4/2.9/0.75/7.0/78.0 (mass ratio), and then dispersed with 0.3 mm zirconia beads to obtain pigment dispersion liquid 20 containing the pigment red, the pigment yellow, and the compound D-10.

Comparative Example 13

Comparative red colored resin composition 19 was obtained in the same manner as in Example 14 except that the pigment dispersion liquid 20 obtained in Comparative Example 12 was used in place of the pigment dispersion liquid 1 obtained in Example 1.

Comparative Example 14

C.I. pigment green 36, pigment yellow 150, the compound 1-17 having the above structure, Disperbyk-2001, Solsperse 5000, and PGMEA were mixed at a composition ratio of 10.0/4.3/0.75/6.0/1.0/78.0 (mass ratio), and then dispersed with 0.3 mm zirconia beads to obtain pigment dispersion liquid 21 containing the compound 1-17, the pigment green, and the pigment yellow.

Comparative Example 15

Comparative green colored resin composition 20 was obtained in the same manner as in Example 14 except that the pigment dispersion liquid 21 obtained in Comparative Example 14 was used in place of the pigment dispersion liquid 1 obtained in Example 1.

<Evaluation of Spectral Spectrum and Film Thickness>

Each of the colored resin compositions 1 to 17 obtained in Examples 14 to 26 and Comparative Examples 4 to 6 and 9 was applied on a glass substrate by a spin coater, prebaked under conditions of 80° C. for 100 seconds, and thereafter irradiated with an ultraviolet ray at 1000 mJ/cm$^2$ using a high-pressure mercury lamp to cure the colored resin composition, followed by heating at 200° C. to obtain an optical filter. The spectral transmittance of the obtained optical filter in the range of 400 to 2000 nm was measured at a sampling pitch of 1 nm using a spectrophotometer (an ultraviolet-visible spectrophotometer UV-3150, manufactured by Shimadzu Corporation). Based on the obtained measured values, the spectral characteristics of each color optical filter were evaluated according to the following criteria. The film thickness of the optical filter was measured with a stylus profilometer. These results are shown in Tables 1 to 3.

<Evaluation Criteria of Red Color Filters (Optical Filters Comprised of Colored Resin Compositions 1 to 3, 10, 11 and 14 obtained in Examples 14 to 16, 23, 24 and Comparative Example 4)>

○ (Good): Spectral transmittance at 450 to 550 nm is 20% or less; spectral transmittance at 600 to 700 nm is 70% or more, and spectral transmittance at 750 to 2000 nm has a minimum value of 80% or less.

X (Poor): Spectral transmittance does not satisfy the above-mentioned requirement for being good.

<Evaluation Criteria, of Blue Color Filters (Optical Filters Comprised of Colored Resin Compositions 4 to 6, 12, 13, and 15 and Colored Resin Composition 17 Obtained in Examples 17 to 19, 25 and 26 and Comparative Examples 5 and 9)>

○ (Good): Spectral transmittance at 420 to 500 nm is 60% or more; spectral transmittance at 600 to 750 nm is 20% or less, and spectral transmittance at 750 to 2000 nm has a minimum value of 80% or less.

X (Poor): Spectral transmittance does not satisfy the above-mentioned requirement for being good.

<Evaluation Criteria of Green Color Filters (Optical Filters Comprised of Colored Resin Compositions 7 to 9 and Colored Resin Composition 16 Obtained in Examples 20 to 22 and Comparative Example 6)

○ (Good): Spectral transmittance at 400 to 450 nm is 20% or less; spectral transmittance at 500 to 580 nm is 50% or more, and spectral transmittance at 750 to 2000 nm has a minimum value of 80% or less.

X (Poor): Spectral transmittance does not satisfy the above-mentioned requirement for being good.

TABLE 1

Evaluation results of spectral transmittance and film thickness

| | Spectral transmittance | Film thickness (μm) |
|---|---|---|
| Example 14 | ○ | 1.0 |
| Example 15 | ○ | 0.9 |
| Example 16 | ○ | 1.0 |
| Example 23 | ○ | 1.0 |
| Example 24 | ○ | 0.9 |
| Comparative Example 4 | X | 0.9 |
| Example 17 | ○ | 1.0 |
| Example 18 | ○ | 1.0 |
| Example 19 | ○ | 1.1 |
| Example 25 | ○ | 0.9 |
| Example 26 | ○ | 0.9 |
| Comparative Example 5 | X | 1.0 |
| Example 20 | ○ | 0.9 |
| Example 21 | ○ | 1.0 |
| Example 22 | ○ | 1.0 |

TABLE 1-continued

Evaluation results of spectral transmittance and film thickness

| | Spectral transmittance | Film thickness (μm) |
|---|---|---|
| Comparative Example 6 | X | 0.9 |
| Comparative Example 9 | X | 0.9 |

<Evaluation Criteria of Spectral Spectra of Red Color Filters (Optical Filters Comprised of Colored Resin Composition 1 and Colored Resin Compositions 10 and 11 Obtained in Example 14 and Examples 23 and 24)>

Evaluation was made based on criteria for better conditions satisfying both red spectral characteristics in a visible region and spectral characteristics in a near-infrared region.

Since the high red spectral transmittance characteristics for the visible region are required, the spectral transmittance at 400 nm is required to be 20% or less; the spectral transmittance of a convex shape at 530 nm is required to be 15% or less; the spectral transmittance at 610 nm is 85% or more; the infrared region is required to sufficiently have absorption in a long wavelength region of 900 nm or more in terms of the characteristics of the sensor; and the maximum value of the spectral transmittance at 910 nm is required to be 60% or less. A case where the above was satisfied was taken as good (○), and a case where the above was out of the range was taken as moderate (Δ). The spectral transmittances at wavelengths were shown in parentheses in Table 2.

<Evaluation Criteria of Spectral Spectra of Blue Color Filters (Optical Filters Comprised of Colored Resin Composition 4 and Colored Resin Compositions 12 and 13 Obtained in Example 17 and Examples 25 and 26)>

Evaluation was made based on criteria for better conditions satisfying both blue spectral characteristics in a visible region and spectral characteristics in an infrared region.

Since the high blue spectral transmittance characteristics for the visible region are required, the spectral transmittance at 450 nm is required to be 70% or more; the spectral transmittance at 700 nm is required to be 15% or less; the 50% spectral transmittance wavelength is required to fall within the range of 510 nm±5 nm; the near-infrared region is required to sufficiently have absorption in a long wavelength region of 900 nm or more in terms of the characteristics of the sensor; and the maximum value of the spectral transmittance at 910 nm is required to be 80% or less. A case where the above was satisfied was taken as good (○), and a case where the above was out of the range was taken as moderate (Δ). The spectral transmittances at wavelengths were shown in parentheses in Table 3.

TABLE 2

Evaluation of spectral transmittance of visible portion and infrared portion (red color filter)

| | 400 nm (20% or less) | 530 nm (15% or less) | 610 nm (85% or more) | 910 nm (60% or less) | Comprehensive evaluation |
|---|---|---|---|---|---|
| Example 14 | ○ (10) | ○ (9) | ○ (99) | ○ (51) | ○ |
| Example 23 | ○ (17) | ○ (11) | Δ (70) | Δ (80) | Δ |
| Example 24 | ○ (16) | ○ (11) | Δ (72) | Δ (78) | Δ |

TABLE 3

Evaluation of spectral transmittance of visible portion and infrared portion (blue color filter)

| | 450 nm (70% or more) | 700 nm (15% or less) | 50% transmissivity wavelength (510 ± 5 nm) | 910 nm (80% or less) | Comprehensive evaluation |
|---|---|---|---|---|---|
| Example 17 | ○ (77) | ○ (11) | ○ (509 nm) | ○ (76) | ○ |
| Example 25 | ○ (73) | ○ (7) | ○ (506 nm) | Δ (81) | Δ |
| Example 26 | ○ (80) | ○ (11) | Δ (505 nm) | Δ (85) | Δ |

From the results of Table 1, it was confirmed that the optical filter (serving as a color filter and an infrared cut filter) formed from the colored resin composition of the present invention had a thickness equivalent to those of the color filters of the comparative examples, but had spectral characteristics as an infrared cut filter in addition to the spectral transmittance of a common color filter.

From the results of Tables 2 and 3, it was found out that the optical filters (serving as a color filter and an infrared color filter) formed from the colored resin compositions of Examples 14 and 17 each comprising the compound No. 2 obtained in Synthesis Example 1 were excellent than the optical filters formed from the compositions of Examples 23, 24, 25, and 26 comprising the compound No. 5 or No. 41. In other words, these results reveal that the optical fibers comprised of the compound No. 2 were particularly excellent as compared with the compounds Nos. 5 and 41.

<Evaluation of Heat Resistance>

The obtained optical filter was heated at 230° C. for 60 minutes, and the spectral transmittances of the optical filter in the range of 400 to 2000 nm before and after heating were measured at a sampling pitch of 1 nm with a spectrophotometer (an ultraviolet-visible spectrophotometer UV-3150 manufactured by Shimadzu Corporation). Based on the spectral change in each wavelength range before and after heating at 230° C. for 60 minutes, the heat resistance of each color optical filter was evaluated according to the following evaluation criteria. These results are shown in Tables 4 to 6.

<Evaluation Criteria of Red Color Filters (Optical Filters Obtained in Examples 14 to 16 and Comparative Example 13)>

○ (Good): The transmittance after the heat resistance test is 20% or ess at 400 nm, 15% or less at 530 nm, 85% or more at 610 nm, and 60% or less at 910 nm.

X (Poor): The spectral change rate does not satisfy the above-mentioned requirement for being good.

<Evaluation Criteria of Blue Color Filters (Optical Filters Obtained in Examples 17 to 19 and Comparative Example 11)>

○ (Good): The transmittance after the heat resistance test is 70% or more at 450 and 15% or less at 700 nm. The 50% spectral transmittance wavelength falls within the range of 510 nm±5 nm. The transmittance at 910 nm is 80% or less.

X (Poor): The spectral change rate does not satisfy the above-mentioned requirement for being good.

<Evaluation Criteria of Green Color Filters (Optical Filters Obtained in Examples 20 to 22 and Comparative Example 15)>

○ (Good): The transmittance after the heat resistance test is 10% or less at 450 nm, 70% or more at 550 nm, 25% or less at 650 nm, and 80% or less at 910 nm.

X (Poor): The spectral transmittance does not satisfy the above-mentioned requirement for being good.

TABLE 4

Evaluation of heat resistance (red color filter)

| | 400 nm | 530 nm | 610 nm | 910 nm | Comprehensive evaluation |
|---|---|---|---|---|---|
| Example 14 | ○ | ○ | ○ | ○ | ○ |
| Example 15 | ○ | ○ | ○ | ○ | ○ |
| Example 16 | ○ | ○ | ○ | ○ | ○ |
| Comparative Example 13 | ○ | ○ | X | X | X |

TABLE 5

Evaluation of heat resistance (blue color filter)

| | 450 nm | 700 nm | 50% transmissivity wavelength (510 ± 5 nm) | 910 nm | Comprehensive evaluation |
|---|---|---|---|---|---|
| Example 17 | ○ | ○ | ○ | ○ | ○ |
| Example 18 | ○ | ○ | ○ | ○ | ○ |
| Example 19 | ○ | ○ | ○ | ○ | ○ |
| Comparative Example 11 | ○ | ○ | ○ | X | X |

TABLE 6

Evaluation of heat resistance (green color filter)

| | 450 nm | 550 nm | 650 nm | 910 nm | Comprehensive evaluation |
|---|---|---|---|---|---|
| Example 20 | ○ | ○ | ○ | ○ | ○ |
| Example 21 | ○ | ○ | ○ | ○ | ○ |
| Example 22 | ○ | ○ | ○ | ○ | ○ |
| Comparative Example 15 | ○ | ○ | ○ | X | X |

<Evaluation of Patterning>

Each of the colored resin compositions obtained in Examples 14 to 26 was applied on a silicon substrate with an organic base film (UC-2L manufactured by Nippon Kayaku Co., Ltd.) by a spin coater, prebaked at 80° C. for 100 seconds, thereafter irradiating the colored resin composition with an ultraviolet ray at 1000 mJ/cm² using an i-line stepper through a reticle to cure the colored resin composition, and subsequently developing the colored resin composition using an alkali aqueous solution containing a surfactant, followed by rinsing with water and heating at 200° C., to obtain a colored pattern. The obtained colored pattern had a resolution of 4 μm square in a line and space, and had no residue or pixel peeling or the like.

INDUSTRIAL APPLICABILITY

The colored resin composition containing the pigment dispersion liquid of the present invention, and the optical filter obtained from the colored resin composition have the functions of both a color filter and a near-infrared ray cut filter, can be made thinner because of a single-layer configuration, and can provide the formation of a fine pattern.

The invention claimed is:

1. A color filter comprising a colored resin composition, the colored resin composition comprising:
 one or more organic color pigments selected from the group consisting of pigment red, pigment green, pigment blue, pigment yellow, and pigment violet;
 an infrared absorbing dye having a maximum absorption wavelength in a wavelength region of 750 to 2000 nm;
 an oil-soluble organic solvent or an aqueous medium; and
 a photopolymerizable monomer;
 wherein the infrared absorbing dye is a compound represented by the following formula (1):

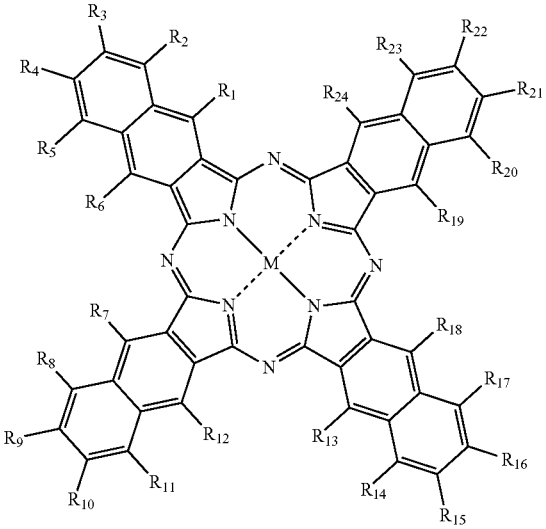

(1)

wherein
 $R_1$ to $R_{24}$ each independently represent a hydrogen atom, a halogen atom, a substituted or unsubstituted alkyl group having 1 to 20 carbon atoms, a substituted or unsubstituted aryl group having 6 to 20 carbon atoms, a substituted or unsubstituted heterocyclic group having 4 to 20 carbon atoms, $-OR_{25}$ or $-SR_{26}$; $R_{25}$ and $R_{26}$ each independently represent a hydrogen atom, a substituted or unsubstituted alkyl group having 1 to 20 carbon atoms, or a substituted or unsubstituted aryl group having 6 to 20 carbon atoms; and M represents two hydrogen atoms, a metal atom, a metal oxide, or a metal halide; and
wherein the color filter is:
 a red color filter showing a spectral transmittance determined with an ultraviolet-visible spectrophotometer after heating at 230° C. for 60 minutes of being 20% or less at 400 nm, being 15% or less at 530 nm, being 85% or more at 610 nm, and being 60% or less at 910 nm;
 a blue color filter showing a spectral transmittance determined with an ultraviolet-visible spectrophotometer after heating at 230° C. for 60 minutes of being 70% or more at 450 nm, being 15% or less at 700 nm, falling within the range of 510 nm ±5 nm for 50% spectral transmittance wavelength, and being 80% or less at 910 nm; or
 a green color filter showing a spectral transmittance determined with an ultraviolet-visible spectrophotometer after heating at 230° C. for 60 minutes of being 10% or less at 450 nm, being 70% or more at 550 nm, being 25% or less at 650 nm, and being 80% or less at 910 nm.

2. The color filter according to claim 1, wherein the organic color pigment is one or more selected from the group consisting of pigment red 122, pigment red 177, pigment red 209, pigment red 254, pigment red 269, pigment green 7, pigment green 36, pigment green 58, pigment blue 15:3, pigment blue 15:4, pigment blue 15:6, pigment yellow 138, pigment yellow 139, pigment yellow 150, and pigment violet 23.

3. The color filter according to claim 1, wherein the photopolymerizable monomer is an acrylate monomer.

4. The color filter according to claim 3, wherein the photopolymerizable monomer is an alkylene oxide-modified acrylate monomer.

5. The color filter according to claim 1, the colored resin composition further comprising an aminoalkylphenone-based photopolymerization initiator or an oxime-based photopolymerization initiator.

6. A solid-state image sensing device comprising the color filter according to claim 1.

* * * * *